United States Patent [19]

Kasumi et al.

[11] Patent Number: 5,448,612
[45] Date of Patent: Sep. 5, 1995

[54] X-RAY EXPOSURE APPARATUS

[75] Inventors: Kazuyuki Kasumi, Atsugi; Naoto Abe, Isehara; Ryuichi Ebinuma, Machida; Takayuki Hasegawa, Yokohama, all of Japan

[73] Assignee: Canon Kabushiki Kaisha, Tokyo, Japan

[21] Appl. No.: 275,661

[22] Filed: Jul. 15, 1994

Related U.S. Application Data

[63] Continuation of Ser. No. 954,143, Sep. 30, 1992, abandoned.

[30] Foreign Application Priority Data

| Sep. 30, 1991 | [JP] | Japan | 3-278373 |
| Oct. 3, 1991 | [JP] | Japan | 3-283627 |
| Oct. 8, 1991 | [JP] | Japan | 3-289171 |
| Oct. 8, 1991 | [JP] | Japan | 3-289274 |
| Oct. 8, 1991 | [JP] | Japan | 3-289283 |
| Oct. 30, 1991 | [JP] | Japan | 3-311836 |

[51] Int. Cl.⁶ ............................ G21K 1/06
[52] U.S. Cl. .................... 378/84; 378/34; 378/85
[58] Field of Search ............ 378/34, 35, 84, 85

[56] References Cited

U.S. PATENT DOCUMENTS

| 5,159,621 | 10/1992 | Watanabe et al. | 378/161 |
| 5,195,113 | 3/1993 | Kuwabara | 378/34 |

FOREIGN PATENT DOCUMENTS

| 0421746 | 4/1991 | European Pat. Off. |  |
| 3155100 | 7/1991 | Japan . |  |
| 3288422 | 12/1991 | Japan | 378/34 |
| 4045417 | 2/1992 | Japan . |  |
| 4080700 | 3/1992 | Japan . |  |
| 4169900 | 6/1992 | Japan . |  |

Primary Examiner—David P. Porta
Attorney, Agent, or Firm—Fitzpatrick, Cella, Harper & Scinto

[57] ABSTRACT

An X-ray apparatus is disclosed which includes a mirror having a reflection surface, for expanding an X-ray beam in a predetermined direction, a detecting device for detecting a relative positional relationship between the X-ray beam and the reflection surface with respect to a direction perpendicular to the reflection surface, and an adjusting device for adjusting the relative position of the X-ray beam and the reflection surface on the basis of the detection. Also disclosed is an exposure apparatus and a semiconductor device manufacturing method using the X-ray apparatus.

32 Claims, 32 Drawing Sheets

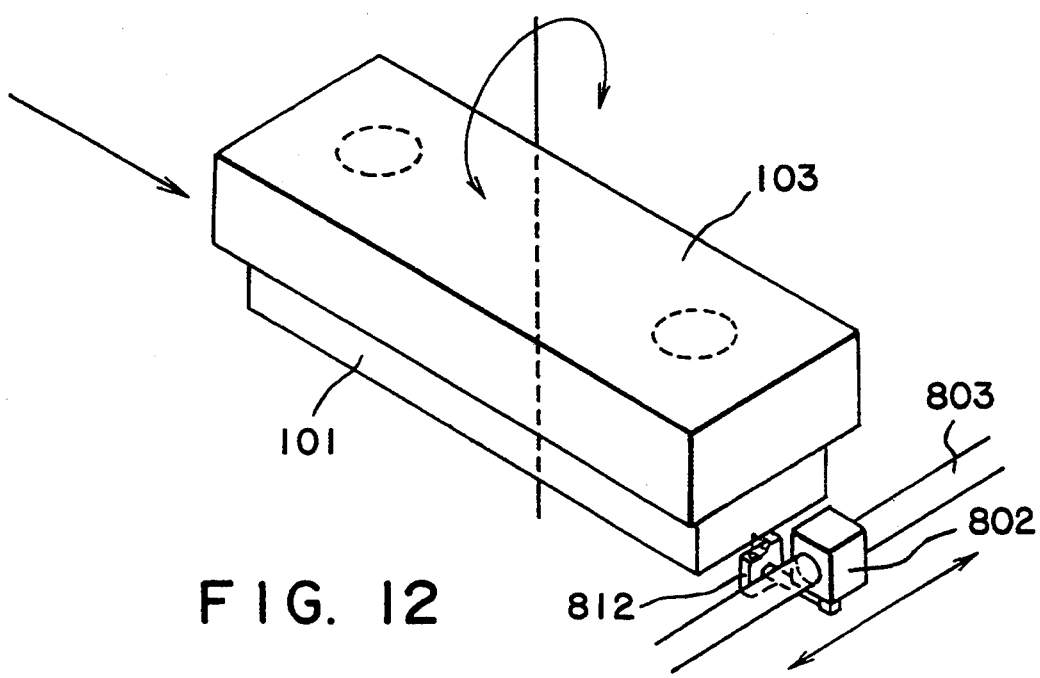
FIG. 12
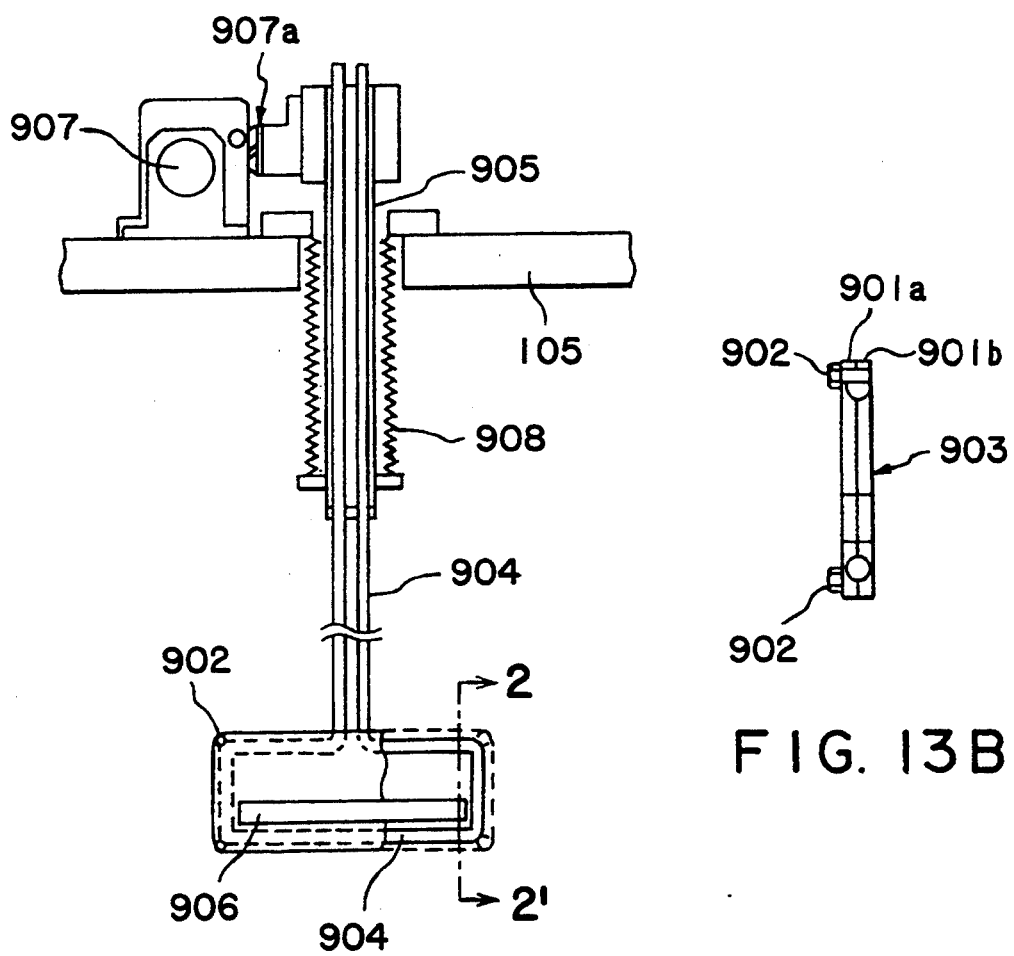
FIG. 13A
FIG. 13B

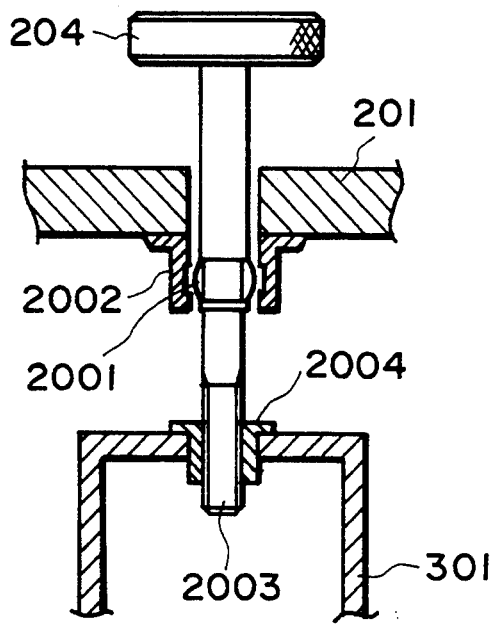
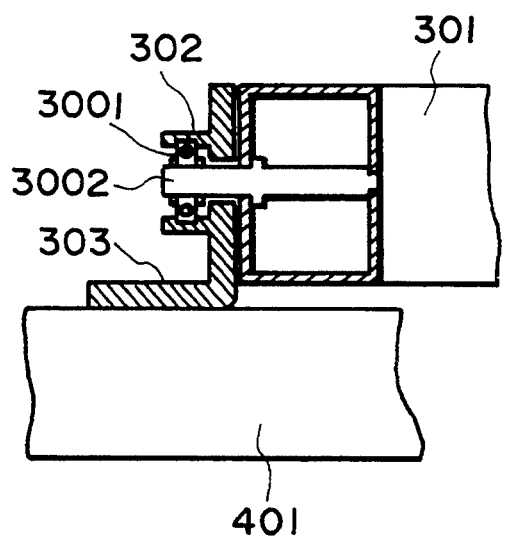
F I G. 21   F I G. 22
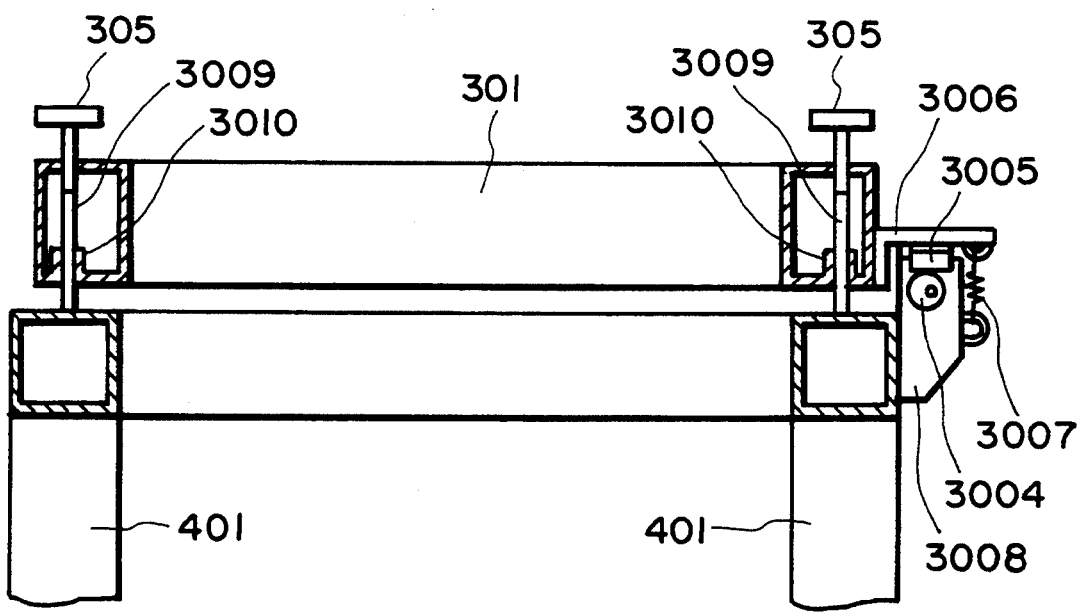
F I G. 23

X-RAY EXPOSURE APPARATUS

This application is a continuation of application Ser. No. 07/954,143, filed Sep. 30, 1992, now abandoned.

FIELD OF THE INVENTION AND RELATED ART

This invention relates to an exposure apparatus and, more particularly, to an X-ray exposure apparatus using synchrotron radiation X-rays (SR X-rays) for transferring and printing a pattern of a mask onto a subsgrate such as a wafer.

With increasing degree of integration of a semiconductor device, exposure apparatuses using synchrotron radiation X-rays (SR X-rays) have been developed which apparatuses are able to transfer and print a fine pattern, of a minimum linewidth ¼ micron, for manufacture of a DRAM of 100 megabits or more. The practicalization of such exposure apparatus has been advanced largely by improvements in an exposure system of The type that the SR-X ray beam a sheet-beam shape emitted from an Synchrotron Orbital Radiation (SOR) ring is diverged by a convex mirror in a direction perpendicular to the orbit plane of the SOR ring.

SUMMARY OF THE INVENTION

In such SR-X ray exposure apparatus, uniform X-ray exposure amount has to be kept upon the surface of a substrate being exposed. However, there is a tendency that the strength of SR-X rays at the emission point on the SOR ring attenuates with time. This necessitates continuous monitoring of X-ray strength during the X-ray exposure operation as well as controlling the moving speed of an exposure controlling shutter device, adjacent to the substrate, in response to the change in the X-ray strength.

Also, it is necessary to precisely control the relative position and the attitude (tilt and rotation) of the mirror relative to the sheet-beam like X-ray beam from the SOR ring. More particularly, where the direction of advancement of the sheet-beam like SR-X ray beam is taken in a z-axis direction, the thickness thereof is taken in a y-axis direction and the width thereof is taken in an x-axis direction, it is necessary to position, very precisely, the reflection surface of the mirror in the three axial directions (x, y and z) as well as rotational directions (wx, wy and wz) about the three axial directions, respectively.

It is an object of the present invention to provide an improved exposure apparatus that assures more precise-pattern printing operation.

It is another object of the present invention to provide a semiconductor device manufacturing method based on such an exposure apparatus as above.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 12 is a schematic view of a portion of the mirror unit.

FIGS. 13A and 13B are schematic views, respectively, each showing a portion of the mirror unit.

FIG. 21 is a schematic view of a portion of the mirror unit.

FIG. 22 is a fragmentary and sectional view of the mirror unit.

FIG. 23 is a fragmentary and sectional view of the mirror unit.

DESCRIPTION OF THE PREFERRED EMBODIMENTS

Figure 1:
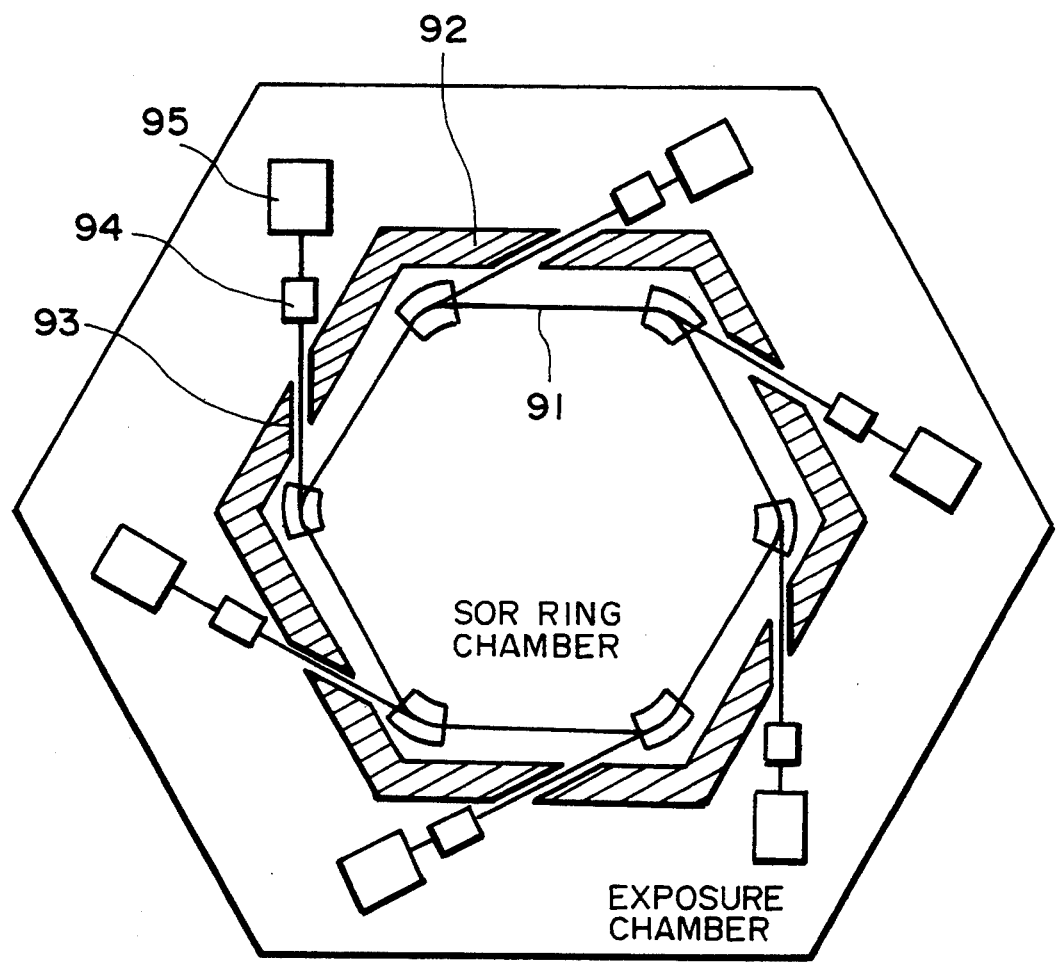
FIG. 1 is a schematic view of the general arrangement of an SOR exposure apparatus according to an embodiment of the present invention.

Referring to FIG. 1 showing the general arrangement of a semiconductor manufacturing SOR exposure apparatus, an SOR ring 91 for generating synchrotron radiation light is disposed in an SOR ring chamber encircled by a hexagonal radiation shield wall 92. Six beam ducts 93 are provided so as to extract the radiation light out of the SOR ring chamber toward an exposure chamber. Around the radiation shield chamber 92, there are six X-ray mirror units 94 and six exposure apparatuses 95, corresponding to the six beam ducts. Each beam duct guides an SR X-ray bean of sheet beam shape which is then expanded by a corresponding mirror unit 94 including an X-ray reflection mirror, whereby the beam is shaped into a desired beam shape. The thus shaped beam is directed to a corresponding exposure apparatus 95. In that exposure apparatus 95, the introduced SR x-rays are used as an exposure energy for transferring and printing a pattern of a mask onto a wafer.

Figure 2:
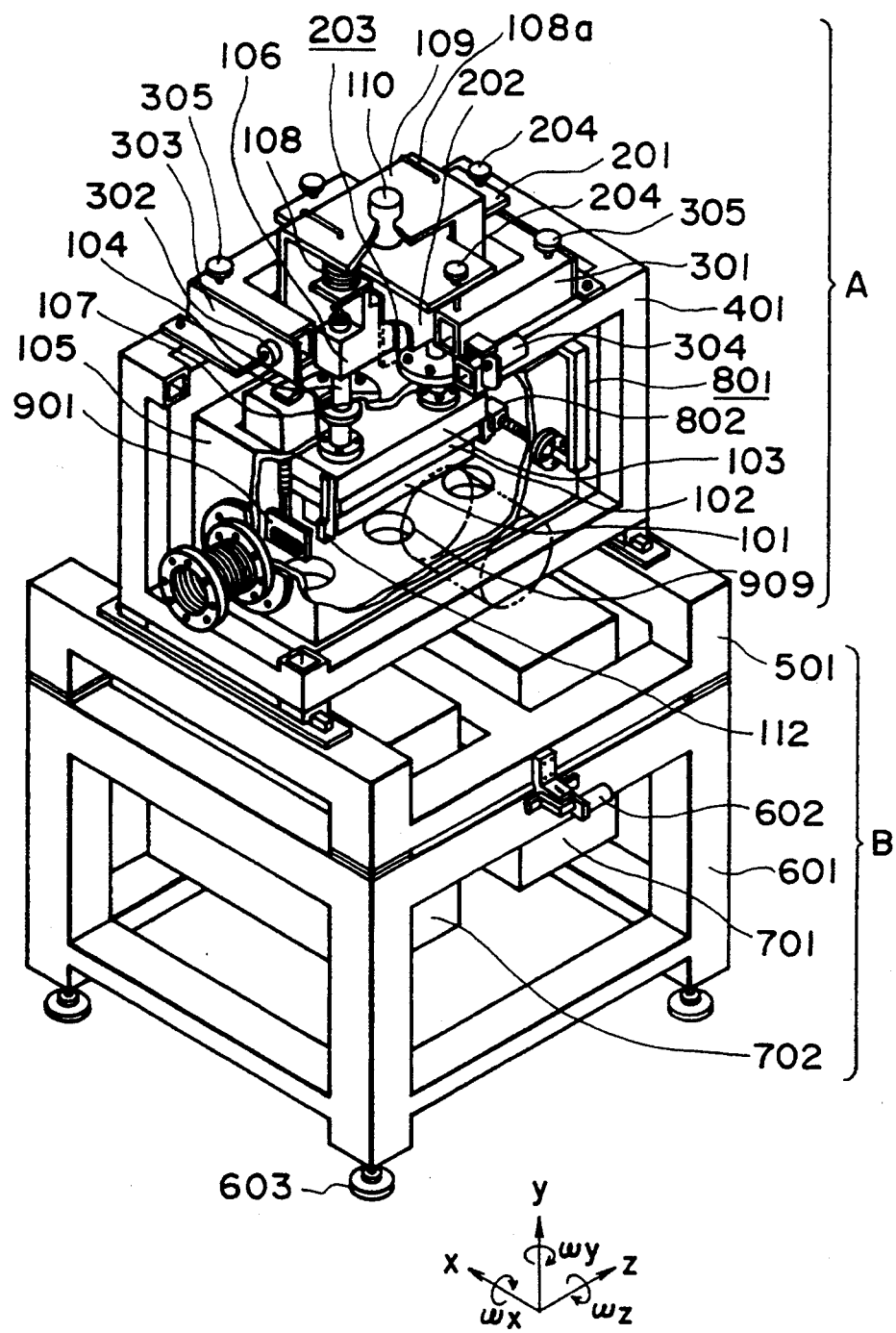
FIG. 2 is a perspective view of a mirror unit according to a first embodiment of the present invention.
Figure 3:
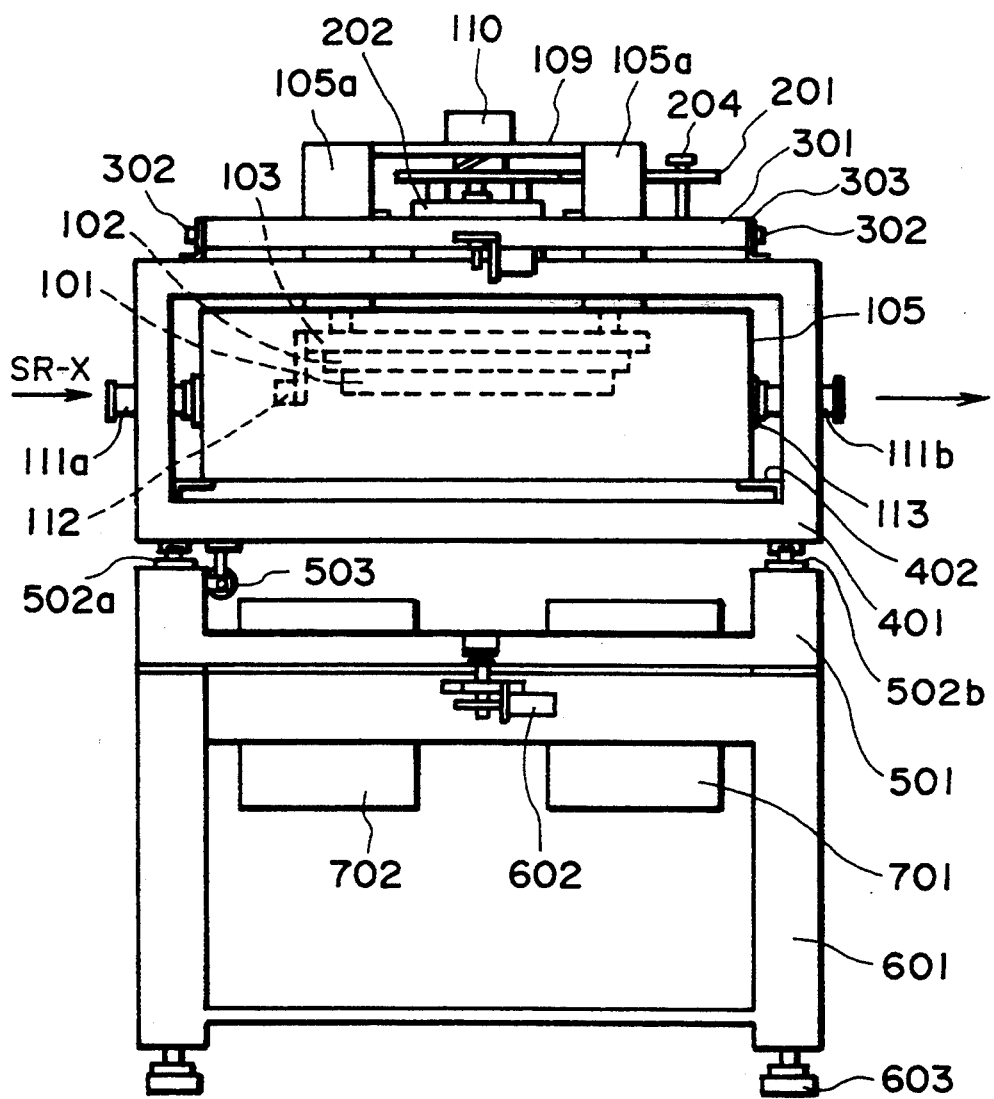
FIG. 3 is a side view of the mirror unit of the first embodiment.

FIG. 2 is a partially broken perspective view showing details of the mirror unit of this embodiment, and FIG. 3 is a side view thereof wherein a detector unit arid a shutter unit are demounted.

Convex mirror 101, having a facing-down reflection surface defined by a partial cylindrical surface, is held by a mirror holder 102 which is mountably and demountably fixed to a holder supporting plate 103. The plate 103 is fixed to a lower end of a mirror supporting rod (coupling means) 104 which extends through an opening of a vacuum chamber 105 and is connected to a mirror support 106 disposed above the chamber 105. Shutter unit S disposed adjacent to an end of the mirror 101 has its driving means supported by an upper wall of the vacuum chamber 105. Bellows 107 is disposed between a peripheral portion of the opening of the vacuum chamber 105 and a flange portion of the mirror supporting rod 104. The rod 104 is tiltable and is movable, upwardly and downwardly, without damaging the vacuum ambience (e.g. about $10^{-7}-10^{-10}$ (Torr)) within the vacuum chamber 105. Namely, the clearance between the mirror support 104 and the opening of the vacuum chamber 105 is sealed by the bellows 107.

The vacuum chamber 105 is provided with beam connection bellows 111a and 111b at its opposite sides, and these bellows are coupled to SR X-ray ducts (not shown), respectively, so as to introduce-into the vacuum chamber the SR X-rays, emitted from the SOR ring to the irradiation chamber.

An end of the holder supporting plate 103 holds an X-ray position sensor (X-ray position detecting means) 112 which serves to detect any relative displacement of the SR X-ray beam, introduced from the beam connecting bellows 111a into the vacuum chamber 105, relative to the mirror 101 and in the y-axis direction.

The mirror support 106 can be moved reciprocally in a direction (y-axis direction) perpendicular to the reflection surface of the mirror 101 by means of a combination of a ball nut and a ball screw which is driven by a y-axis driving motor (driving means) 110. Tilt plate 201 is integrally fixed to a housing 202 which supports the mirror support 106 rectilinearly movably in the y-axis direction through the cooperation with a y-axis rectilinear guide (guide means) 203. The tilt plate 201 is fixed to a flat reference frame 301 by means three "wx" and "wz" adjusting screws 204, such that the direction and angle of the tilt of the tilt plate 201 relative to the reference frame 301 can be adjusted by the "wx" and "wz" adjusting screws 204.

The reference frame 301 is supported by a pair of bearing devices 302 disposed at the opposite ends thereof, rotatably around a longitudinal axis (z axis) of the mirror 101. Each beating device 302 is fixed to a central part of an L-shaped rod 303 having its opposite ends mesh engaged to the top of a skeleton type main frame 401.

The rotating angle of the reference frame 301 around the z axis can be adjusted by a cam mechanism which is driven by a wz driving motor 304. After such rotation adjustment, a locking screw 305 is fastened whereby the reference frame 301 is fixed relative to the main frame 401. Detector unit D is mount ably and demountably provided in the forward end portion, along the z-axis direction, of the bottom surface of the reference frame 301.

The main frame 401 serves to support the bottom of the vacuum chamber 105 through the cooperation with a pair of L-shaped members 402. Each member 402 is made of a material having small rigidity and it serves to absorb deformation of tile vacuum chamber 105 when its inside pressure is decreased from a normal pressure to a vacuum ambience pressure (e.g. about $10^{-7}-10^{-010}$ (Tort)) to thereby prevent distortion of the main frame 401.

As illustrated in FIG. 3, the vacuum chamber 105 is held within the main frame 401 by means of the L-shaped members 402 fixed to the bottom of the main frame 401. On the other hand, the mirror 101 is supported by a mirror attitude adjusting means comprising the tilt plate 201 and the reference frame 301, supported at the top of the main frame, through the mirror supporting rod 104 and the mirror support 106.

Next, a supporting table structure B for supporting the main frame 401 will be explained. The supporting table structure B comprises an upper table 501 of flat frame shape and a lower table 601 of skeleton frame shape. The main frame 401 is movable reciprocally in the transverse direction (x-axis direction) of the mirror 101, along a pair of x-guide rails 502a and 502b provided on the upper table 501. The movement of the main frame 401 in the x-axis direction is provided by manually rotating an x-axis feeding screw 503 mounted on the upper table 501.

The upper table 501 is supported on the lower table 601 rotatably around its vertical central axis (y axis). The rotating angle around the y axis can be adjusted by a cam mechanism which is driven by a wy driving motor means 602 which is a third driving means having a driving motor as a drive source. The lower table 601 has legs 603, the length of each of which can be adjusted to adjust the direction and the angle of tilt of the lower table, i.e., the Silt of the supporting table structure B and the main frame 401 relative to the floor surface. Ion pump 701 and NEG pump 702 are disposed in She inside of the supporting table structure B (comprising the upper and lower tables 501 and 601) and just below the vacuum chamber 105.

The initial positioning of the mirror is executed by adjusting the tilt plate 201 and the reference frame 301 of the above-described mirror attitude adjusting device A, the main frame 401 and the upper and lower tables 501 and 601 of the supporting table structure B in the manner described hereinbefore.

Figure 6:
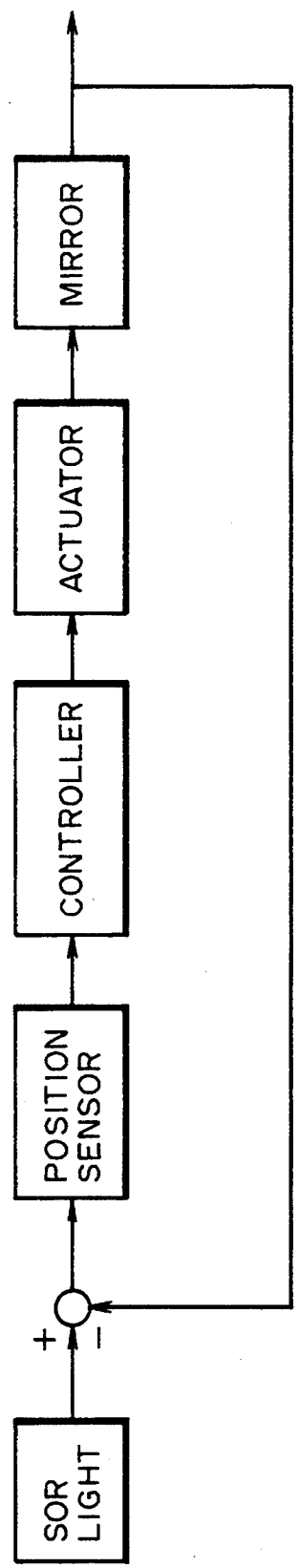
FIG. 6 is a block diagram of a control circuit.

If the relative position of the SR X-ray beam and the reflection surface of the mirror 101 changes during the exposure operation due to vibration, a change in temperature or fluctuation of SR X-ray beam itself, the locking device of the mirror support 106 is released and the y-axis driving motor 110 is driven in response to an output of the X-ray position sensor 112 to thereby move the mirror 101 in the y-axis direction. After removing the non-uniformness of illumination in the exposure region on a wafer in this manner, the mirror support 106 is locked again by the locking device. The control circuit provided for such mirror position control is such as shown in FIG. 6. If the relative position of the SR X-ray beam and the reflection surface of the mirror is not stable, the locking mechanism may be normally released to allow that the mirror 101 is controllably displaced to a suitable position in response to the output of the X-ray position sensor 112.

Next, the mirror support will be explained in greater detail.

Figure 4:
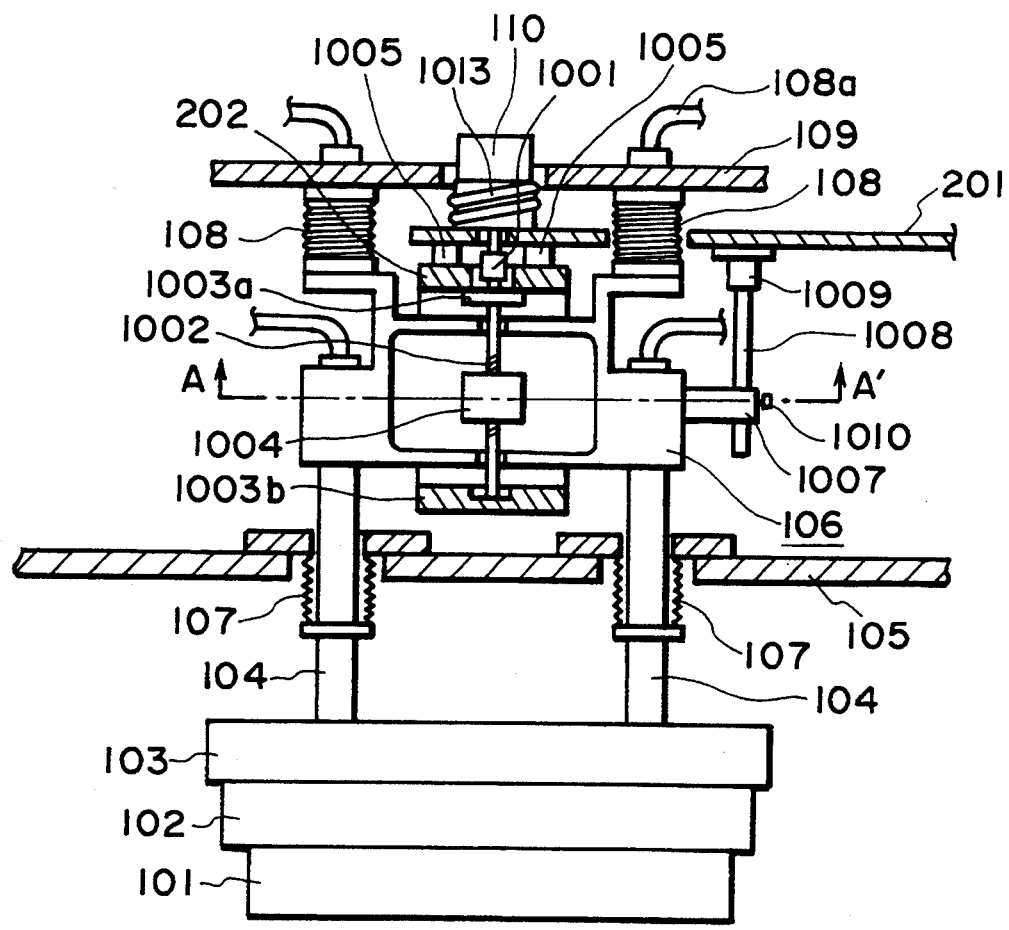
FIG. 4 is a fragmentary and side view of the mirror unit.
Figure 5:
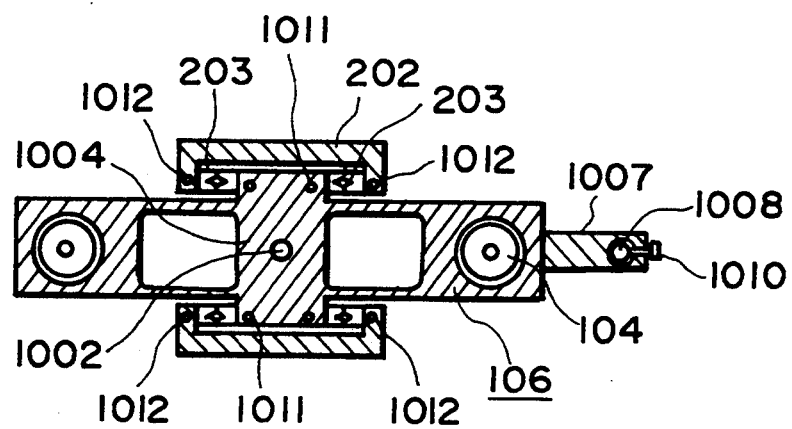
FIG. 5 is a fragmentary and sectional view of the mirror unit.

As illustrated in FIGS. 4 and 5, the y-axis driving motor has its rotational shaft coupled to a ball screw 1002 through a coupling 1001. The ball screw 1002 is, at its opposite end portions, rotatably supported by a radial bearing 1003a and a thrust bearing 1003b which are integral with the housing 202.

The ball screw 1002 has a screw portion formed at its center which is mesh engaged with a ball nut 1004 formed at the central rod-Like portion of the mirror support 106. In response to actuation of the y-axis motor 110, the ball screw 1002 rotates to move the ball nut 1004 upwardly or downwardly. This causes the mirror support 1060 integral with the ball nut 1004, along the y-axis direction. The housing 202 is fixed to the tilt plate 201 by means of four connecting plates 1005, and the fine adjustment in the wx and wz directions can be effected by this tilt plate 201. The y-axis rectilinear guide 203 which serves as the guide means for rectilinearly movably supporting the mirror support 106, comprises four y-axis rectilinear guides 203 which are disposed between the housing 202 and the opposite ends of the central rod-like portion of the mirror support 106. Each y-axis rectilinear guide 203 has sufficient rigidity such that, when the mirror support 106 moves in the y-axis direction with the ball nut 1004 in response to rotation of the ball screw 1002, side movement is prohibited and precise positioning is assured.

There is provided a locking device for locking the mirror support 106 relative to the tilt plate 201 in response to setting a fresh y-axis position of the mirror support 106 through the drive of the y-axis driving motor 110. This locking device comprises a rod clamp 1007, a locking rod 1008, a rod support 1009 and a locking bolt 1010. After the mirror support 106 is moved to a fresh y-axis position, the locking bolt 1010 is fastened to lock the mirror support at that position.

Additionally, there is provided cooling means for preventing degradation of dimensional precision due to heat generation in the y-axis driving motor. This cooling means comprises a cooling medical flow passageway 1011 disposed adjacent to the sliding shaft portion of the mirror support 106 and a cooling medium flow passageway 1012 provided to the y-axis rectilinear guides 203 of the housing. By means 6f the cooling medium supplied from a cooling water pipe 1013, any temperature rise in the mirror support 106, the y-axis rectilinear guides 203 and the housing 202 can be prevented.

The cooling means may be used also as means for preventing thermal damage of the y-axis rectilinear guide 203 and the structural portion around it during the baking process in a case where such a baking process is required so as to improve the vacuum level of the vacuum chamber prior To execution of the exposure operation.

The mirror supporting rod 104 held by the mirror support 106 is inserted into the vacuum chamber 105 through the opening where the bellows 107 is provided. The holder supporting plate 103 for mountably and demountably holding the mirror holder 102 is fixed to the lower end of the mirror supporting rod 104. Disposed at the upper end of the mirror support 106 is a counter bellows 108 which is provided between it and the top plate 109, coupled integrally with the vacuum chamber 105 by a partition wall 105a. The counter bellows 108 has the same diameter or cross-sectional area as the bellows 107. The inside pressure of the counter bellows 108 is reduced to a vacuum level by means of a vacuum pipe 108a, whereby any pressure imbalance to be applied to the mirror support 106 can be removed such that any degradation of precision of the y-axis position due to a change in atmospheric pressure can be prevented. Also, it has an advantage of reducing the driving force of the y-axis driving motor 110.

With the arrangement described hereinbefore, any deviation of the relative position of the reflection surface of the mirror and the path of the X-rays during the exposure operation due to vibration, a change in temperature or fluctuation of SR X-rays, can be detected and compensated. Thus, it is possible to prevent non-uniformness in illuminance and thus to assure uniform exposure of the surface of a substrate.

Next, a second embodiment of the present invention will be explained. The general structure of this embodiment is like that of the first embodiment.

Figure 7:
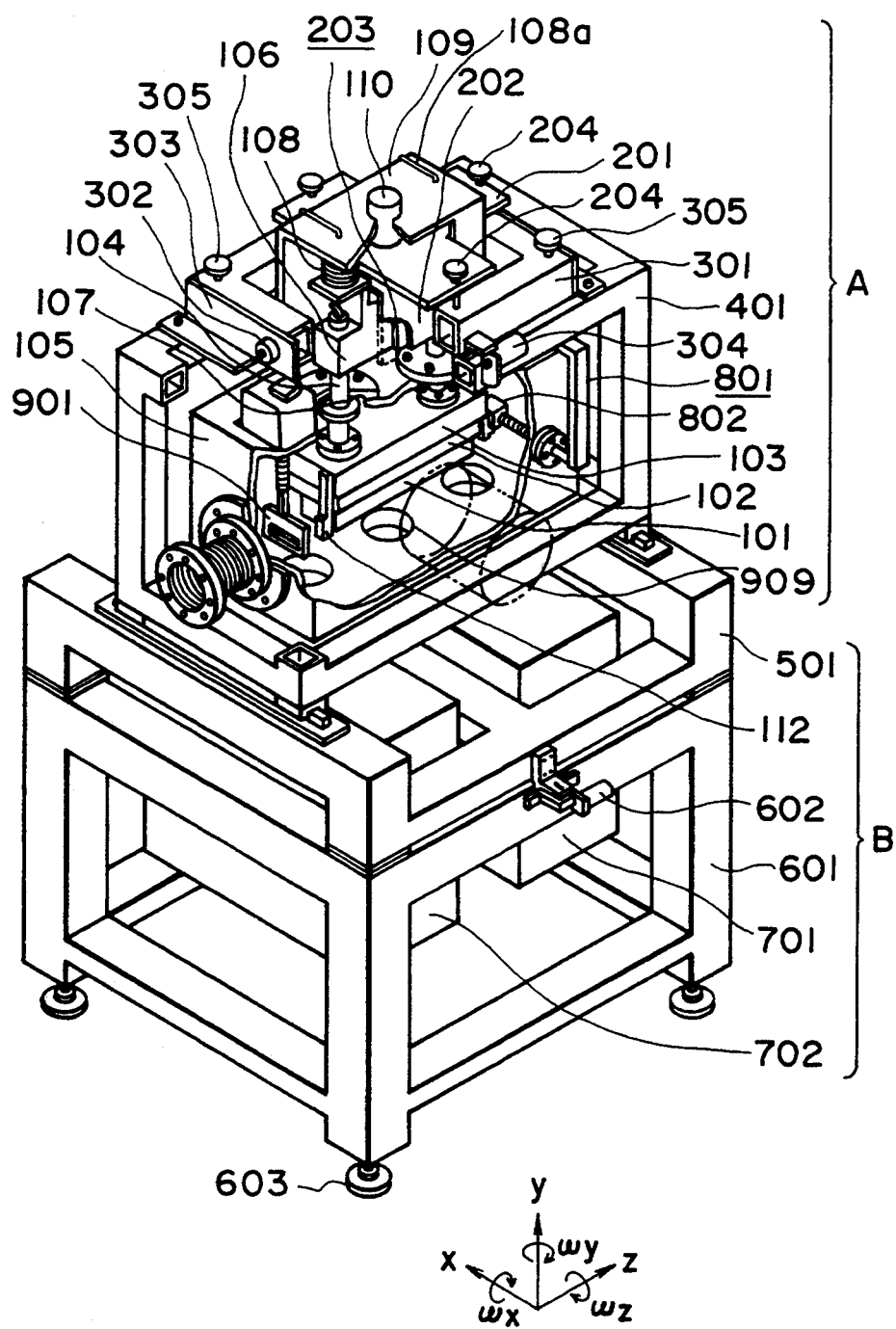
FIG. 7 is a perspective view of a mirror unit according to a second embodiment of tile present invention.
Figure 8:
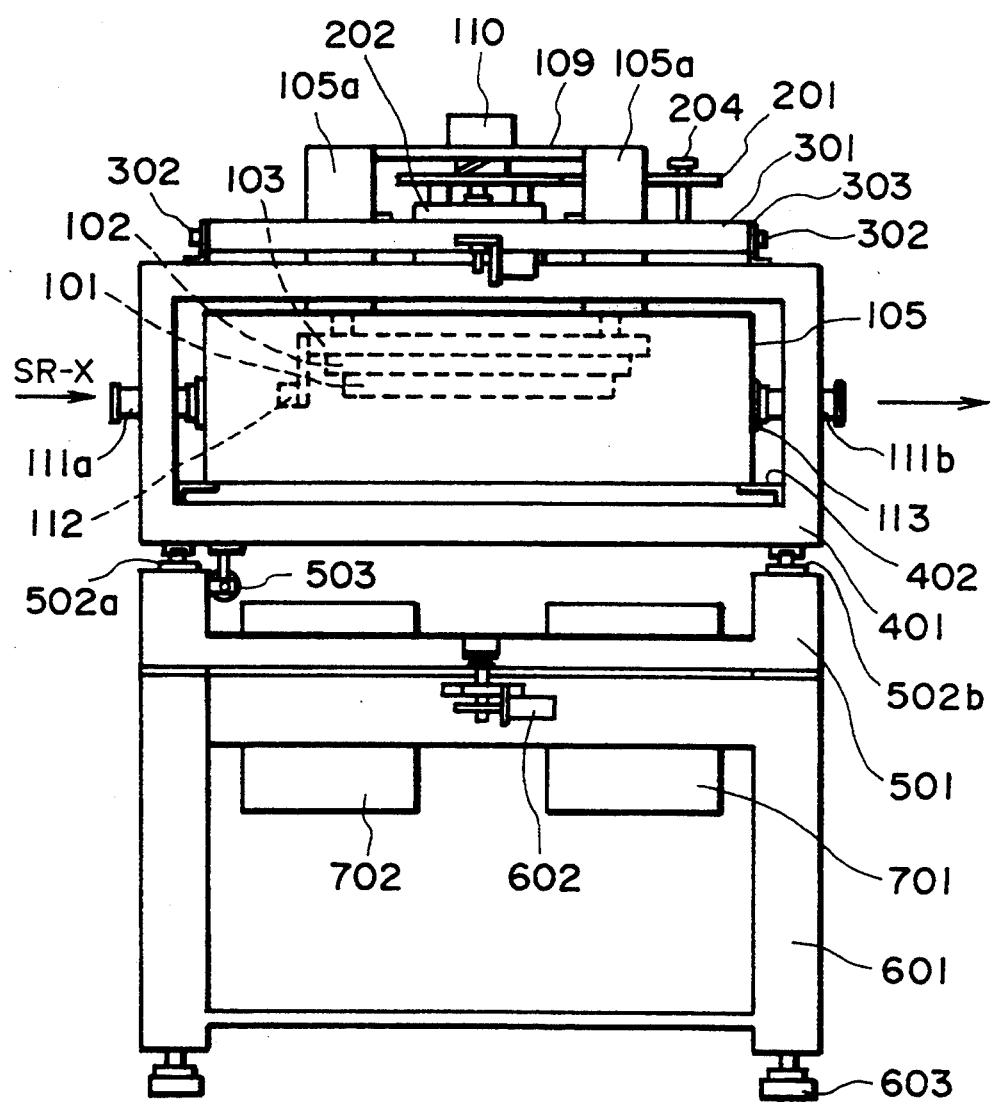
FIG. 8 is a side view of the mirror unit of the second embodiment.

FIG. 7 is a partially broken perspective view showing details of the mirror unit of this embodiment, and FIG. 8 is a side view thereof wherein a detector unit and a shutter unit are demounted. The same reference numerals as those of FIGS. 2 and 3 are assigned to corresponding elements.

Convex mirror 101 having a facing-down reflection surface defined by a partial cylindrical surface is held by a mirror holder 102 which is mountably and demountably fixed to a holder supporting plate 103. The plate 103 is mixed to a lower end of a mirror supporting rod (coupling means) 104 which extends through an opening of a vacuum chamber 105 and is connected to a mirror support 106 disposed above the chamber 105. Shutter unit S disposed adjacent to an end of the mirror 101 has its driving means supported by an Upper wall of the vacuum chamber 105. Bellows 107 is disposed between a peripheral portion of the opening of the vacuum chamber 105 and a flange portion of the mirror supporting rod 104. The rod 104 is tiltable and is movable, upwardly and downwardly, without damaging the ultra-high vacuum audience within the vacuum chamber 105. Namely, the clearance between the mirror support 104 and the opening of the vacuum chamber 105 is sealed by the bellows 107.

The vacuum cheer 105 is provided with beam connection bellows 111a and 111b at its opposite sides, and these bellows are coupled to SR X-ray ducts (not shown), respectively, so as to introduce into the vacuum chamber the SR X-rays, emitted from the ring to the irradiation chamber.

Counter bellows 108 has its lower end fixed to the upper portion of the mirror support 106. The upper end of the counter bellows 108 is fixed to the bottom surface of the top plate 109 which is integrally coupled to the vacuum chamber 105 through a wall plate 105a. The inside space of the counter bellows 108 is reduced to a vacuum level by means of a vacuum pipe 108a which is communicated with a vacuum source.

The mirror support 106 can be moved reciprocally in a direction (y-axis direction) perpendicular to the reflection surface of the mirror 101 by means of a combination of a ball nut and a ball screw (not shown) which is driven by a y-axis driving motor 110. Tilt plate 201 is integrally fixed to a housing 202 which supports the mirror support 106 rectilinearly movably in the y-axis direction through the cooperation with a y-axis rectilinear guide 203 having a cooling medium flow passageway. The tilt plate 201 is fixed to a flat reference frame 301 by means of three "wx" and "wz" adjusting screws 204, such that the direction and angle of the tilt of the tilt plate 201 relative to the reference frame 301 can be adjusted finely by the "wx" and "wz" adjusting screws 204.

The reference frame 301 is supported by a pair of bearing devices 302 disposed at the opposite ends thereof, rotatably around a longitudinal axis (z axis) of the mirror 101. Each bearing device 302 is fixed to a central part of an L-shaped rod 303 having its opposite ends mesh engaged to the top of a skeleton type main frame 401.

The rotating angle of the reference frame 301 around the z axis can be adjusted by a cam mechanism which is driven by a wz driving motor (first driving means) 304. After such rotation adjustment, a locking screw 305 is fastened whereby the reference frame 301 is fixed relative to the main frame 401. Detector unit 801 is mountably and demountably provided in the forward end portion, along the z-axis direction, of the bottom surface of the reference frame 301.

The main frame 401 serves to support the bottom of the vacuum chamber 105 through the cooperation with a pair of L-shaped members 402. Each member 402 is made of a material having small rigidity and it serves to absorb deformation of the vacuum chamber 105 when its inside pressure is decreased from a normal pressure to a ultra-high vacuum ambience pressure to thereby prevent distortion of the main frame 401.

As illustrated in FIG. 8, the vacuum chamber 105 is held within the main frame 401 by means of the L-shaped members 402 fixed to the bottom of the main frame 401. On The other hand, the mirror 101 is supported by a mirror supporting device (mirror supporting means). A comprising the tilt plate 201 and the reference frame 301, supported at the top of the main frame, through the mirror supporting rod 104.

Thus, the vacuum chamber 105 and the mirror supporting device A are coupled to the main frame through separate coupling members, respectively. "As a result, it is possible to execute the y-axis position adjustment (y-axis adjustment) through the mirror 101 the mirror support 106, the rotational adjustment (wz adjustment) around the z-axis through the reference frame 301 and the tilt adjustment (wx and wy adjustment) through the tilt plate 201, very precisely without being affected by the weight or deformation of the vacuum chamber 105.

Also, the transmitting portions of there adjusting mechanisms can be made simple and small in size.

Next, a supporting table structure B for supporting the main frame 401 will be explained. The supporting table structure B comprises an upper table 501 of flat frame shape and a lower table 601 of skeleton frame shape. The main frame 401 is movable reciprocally in the transverse direction (x-axis direction) of the mirror 101, along a pair of x-guide rails 502a and 502b provided on the upper table 501. The movement of the main frame 401 in the x-axis direction is provided by manually rotating an x-axis feeding screw 503 mounted on the upper table 501.

The upper table 501 is supported on the lower table 601 rotatably around its vertical central axis (y axis). The rotating angle around the y axis can be adjusted by a cam mechanism which is driven by a wy driving motor means (second driving means) 602. The lower cable 601 has legs 603, the length of each of which can be adjusted to adjust the direction and the angle of tilt of the lower table, i.e., the tilt of the supporting table structure B and the main frame 401 relative to the floor surface. Ion pump 701 and NEG pump 702 are disposed in the inside of the supporting table structure B (comprising the upper and lower tables 501 and 601) and just below the vacuum chamber 105.

Through the adjustment of the supporting table structure B in the manner described above, with respect to the vacuum chamber 105 and the mirror supporting device A held by the main frame 401 it is possible to execute the adjustment of tilt relative to the floor surface, the adjustment of rotational angle around the y axis (wy adjustment) and the adjustment of x-axis position (x-axis adjustment), very precisely. Also, the thus adjusted position and attitude (rotational angle, direction and angle of tilt) can be maintained stably.

Next, the detector unit will be explained in detail.

Figure 9:
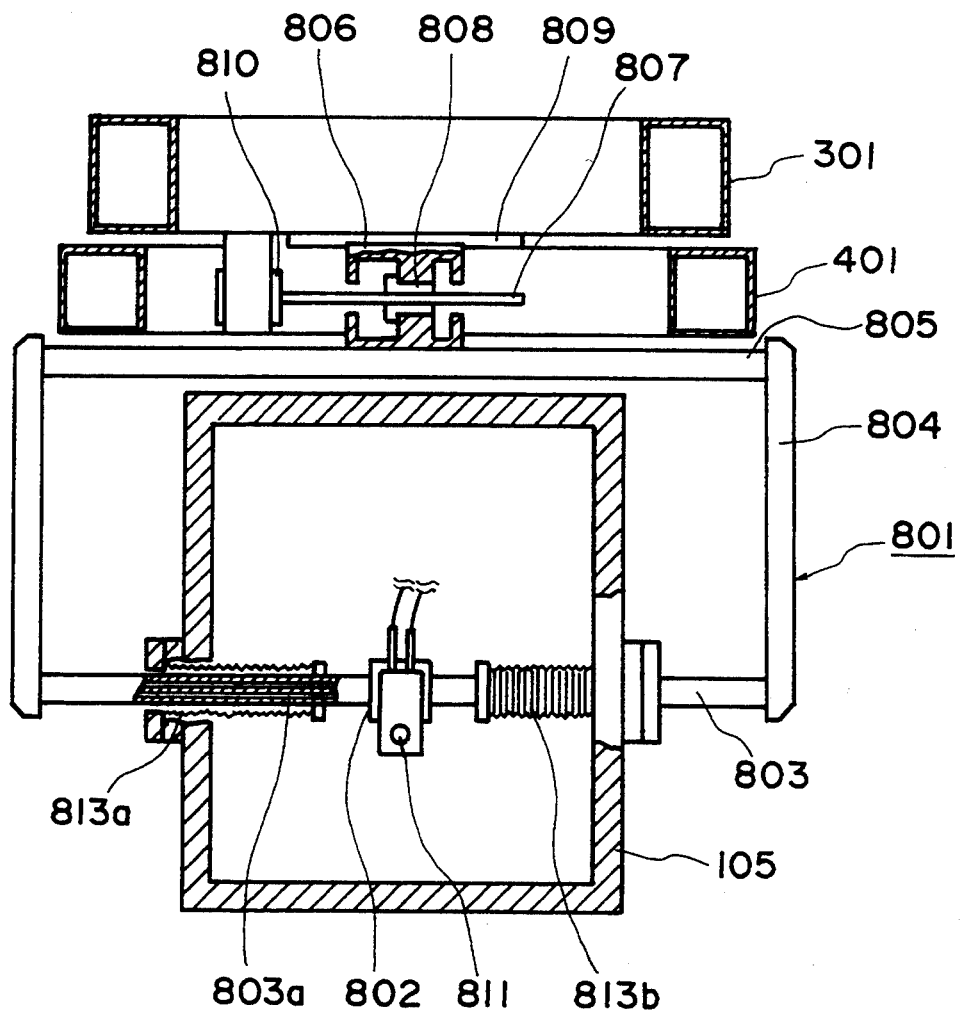
FIG. 9 is a fragmentary view of the mirror unit.

As illustrated in FIG. 9, the detector unit 801 comprises a parallelogram frame (to be described later) and a detector table 802. The detector table 802 is fixed to a table supporting rod 803 which is inserted into the vacuum cheer 105 through an opening formed in the side wall of the vacuum chamber 105. The table supporting rod 803 extends through the vacuum chamber 105 and its opposite ends are connected to the lower ends of holding rods 804, respectively. The upper ends of these holding rods 804 are connected to the opposite ends of a supporting arm 805 which extends laterally above the vacuum chamber and in parallel to the table supporting rod 803. Thus, the table supporting rod 803, the holding rods 804 and the supporting arm 805 provide the parallelogram frame. The supporting arm 805 is integrally fixed to a ball nut supporting member 806. The supporting member 806 holds a ball nut mesh engaged with a ball screw 807, and it is slidable along a guide rail 809, provided integrally with tile reference frame 301, in a direction (x axis) transverse to the path of SR X-rays.

In response to actuation of an x-axis driving motor (third driving means) 810 supported by the reference frame 301, the supporting arm 805 moves along the guide rail 809 in the x-axis direction together with the table supporting rod 803 extending through the vacuum chamber 105. On the detector table 802, an X-ray detector 811 or a displacement sensor 812 (FIG. 12) is mounted demountably. The clearance between the supporting arm 805 and the opening in the side wall of the vacuum chamber 105 is sealed by detector bellows 813a and 813b. Also, a cooling medium flow passageway 803a is provided within the table supporting rod 803.

Figure 10:
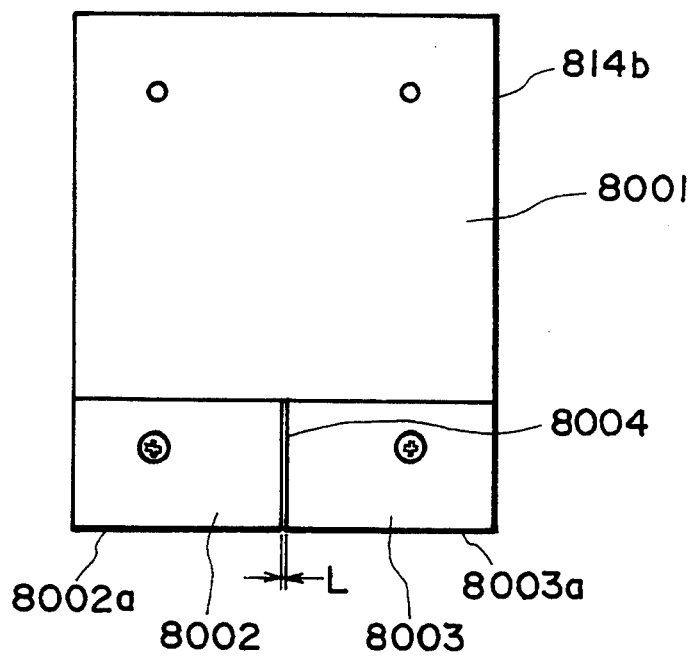
FIG. 10 is a fragmentary view of the mirror unit.

For the "wy" and "wz" adjustment while the x-ray detector (X-ray detecting means) 811 is mounted on the detector table 802, a pair of slit edge members 814a and 814b (FIG. 10) which are detection assistance members are used. Each of these slit edge members comprises a plate-like main member 8001, a left and right slit members 8002 and 8003 fixed to the lower end of The main member 8001, and an interstitial member 8004 disposed between the left and right slit members. By the interstitial member 8004, the clearance L between the left and right slit members is determined. The lower edges 8002a and 8003a of the left and right slit members 8002 and 8003 have been subjected to high-precision finishing treatment.

Next, the manner of "wy" adjustment using the X-ray detector 811 and the slit edge members 814a and 814b will be explained.

Figures 11A, 11B:
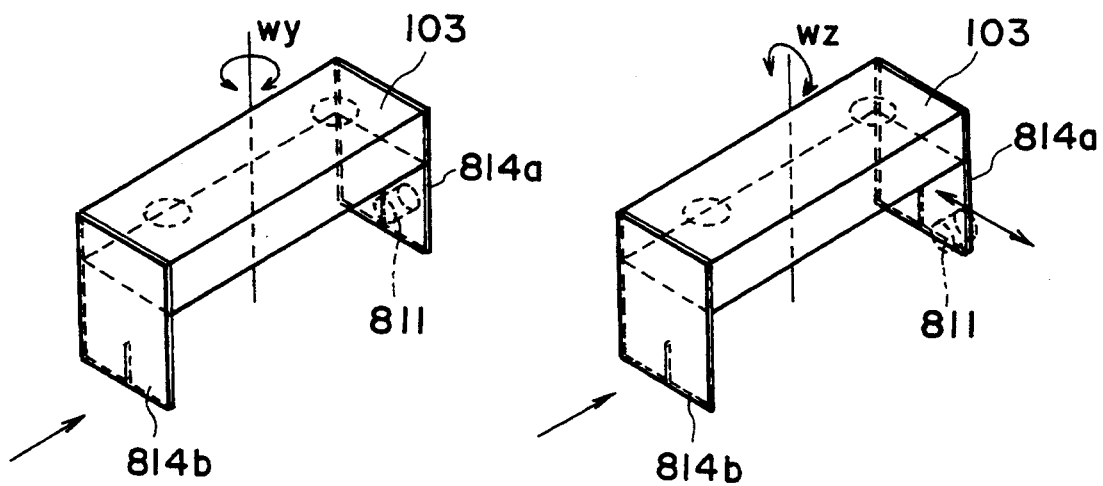
FIGS. 11A and 11B are schematic views, respectively, of a portion of the mirror unit.

Initially, the mirror holder 102 for holding the mirror 101 is demounted from the holder supporting plate 103, and then the slit edge members 814a and 814b are mounted to the front and rear ends of the holder supporting plate 103, respectively, by using bolts. Thereafter, the x-axis driving motor 810 is actuated to stop the detector table 802, carrying thereon the X-ray detector 811, on a straight line connecting the slits of the slit edge members 814a and 814b (FIG. 11A). Then, the pressure of the vacuum chamber 105 is reduced and SR X-rays are introduced. The wy driving motor 602 is actuated to rotate-the upper table 501, and the wy driving motor 602 is stopped when the output of the X-ray detector 811 becomes highest.

The "wz" adjustment may be effected as follows.

As illustrated in FIG. 11B, the y-axis driving motor 110 is actuated to move upwardly the slit edge members 814a and 814b held by the holder supporting plate 103. They are stopped at such position that the upper half of the light receiving surface of the X-ray detector 811 is blocked by the slit edge members 814a and 814b against impingement of X-rays. Then, the x-axis driving motor 810 is actuated to move the detector table 802, carrying thereon the X-ray detector 811, reciprocally in the x-axis direction and, while monitoring change in the output of the X-ray detector 811, the wz driving motor 304 is actuated to rotate the reference frame 301. When the output of the X-ray detector 811 moving in the x-axis direction with the rotation of the reference frame 301 becomes unchanged, the wz motor 304 is stopped and the reference frame 301 is locked to the main frame 401 by the locking screw 305. By doing so, the wz direction of the SR X-ray beam can be reproduced in the wz direction of the reference frame, namely, in the running direction of the detector table 802. Thus, there is no necessity of measuring the "wz" again.

The "wz" adjustment of the tilt plate in a case where the mirror damaged by X-ray exposure is replaced, together with the mirror holder, by a fresh mirror may be carried out with the displacement sensor 812 mounted on the detector table 802, in place of the X-ray detector 811 (FIG. 12). In that occasion, the vacuum chamber is opened to the atmosphere and the mirror holder 102 holding the mirror 101 is fixed to the holder 103. While moving the displacement sensor 812, disposed below the reflection surface of the mirror 101, in the x-axis direction, the change in distance to the facing-down reflection surface of the mirror 101 is measured. The "wx" and "wz" adjusting screws 204 of the tilt plate 201 are rotated so that the change in distance is converged to zero. This adjustment does not need introduction of SR X-rays.

Next, the process of initial positioning prior to execution of the exposure operation will be explained.

After the tilt adjustment using the legs 603 of the lower table 601 and the "x" adjustment of the main frame 401 using the feed screw 503, the beam connecting bellows 111a and 111b are coupled to the SR X-ray beam ducts (not shown). In this state, the tilt adjustment using the legs 603 of the lower table is carried out again, to thereby set the reflection surface of the mirror 101 at a predetermined reflection angle.

Thereafter, the SR X-rays are introduced into the vacuum chamber 105 and, by using the detector unit 801, the rotational adjustment of the lower table 501 using the wy driving motor 602 as well as the rotational adjustment of the reference frame 301 using the wz driving motor 304 are carried out. Finally, any positional deviation of the mirror reflection surface in the y-axis direction is detected by using the X-ray position sensor 112, and the y-axis driving motor 110 is actuated to execute the "y" adjustment of the mirror support 106. The mirror support 106 is then fixed to the tilt plate 201.

After completion of such initial positioning, the detector unit 801 is demounted and the exposure operation is started.

If the reflection surface of the mirror is damaged seriously by the X-ray exposure, the mirror replacement may be effected.

For such mirror replacement, the mirror 101 is replaced together with the mirror holder 102. After this, the tilt of the tilt plate 201 is adjusted by means of the "wx" and "wz" adjusting screws 204 while the running direction of the detector table 802 and the mirror reflection surface are adjusted-on the basis of measuring the amount of "wz" adjustment through the displacement sensor with the detector unit 801 being mounted.

Next, the shutter unit S provided in the apparatus of the present embodiment as well as the cooling water supplying system and the vacuum evacuation system will be explained.

As illustrated in FIGS. 13A and 13B, the shutter unit S has a plate-life main member 903 which comprises a pair of plate-like members 901a and 901b connected by bolts 902 to each other. The plate-like members 901a and 901b define a groove between their adjoining surfaces by which groove a cooling pipe 904 is held. The cooling pipe 904 is disposed along the periphery of the main member 903. At the center of the upper portion of the maim member 903, the cooling pipe is bent upwardly and is inserted into a hollow supporting rod 905. The maim member 903 has a rectangular opening 906, adjoining its lower edge. During the X-ray exposure operation or upon the X-ray detection by the detector unit 801, the sheet-beam like SR X-rays pass through this opening. At the upper and lower ends, the supporting rod 905 sealingly and fixedly holds the cooling pipe 904. The supporting rod 905 can be moved along the longitudinal axis by means of a pinion rack mechanism 907a which is driven by a motor 907 supported by the top wall of the vacuum chamber 105. The clearance between the supporting rod 905 and the opening of the vacuum chamber 105 is sealed by a bellows 908. Immediately after completion of the X-ray exposure operation or the X-ray detecting operation, the motor 907 is actuated to move the main member 903 down to block the SR X-rays, whereby damage of the mirror is reduced.

Figure 14:
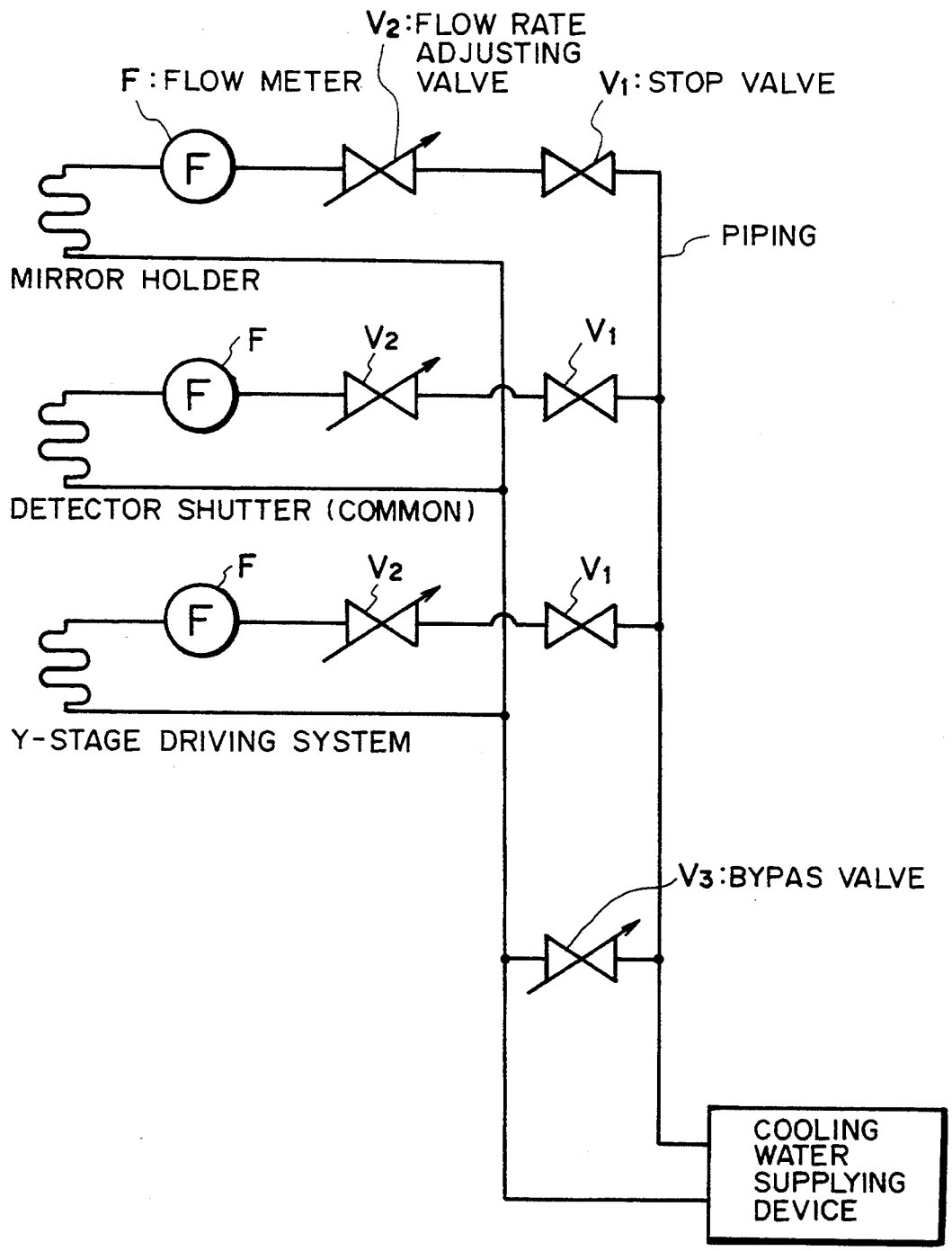
FIG. 14 is a diagrammatic view of a cooling water flow system.

The cooling water supplying system is such as shown in FIG. 14. As the cooling water, constant temperature water which is temperature-controlled to 23° C. is used. To each of the three, systems of the mirror holder, the detector unit and shutter unit, and the y-axis driving system, there is provided a set of a stop valve V1, a flow rate controlling valve V2 and a flow meter F by which the flow of optimum flow rate is assured.

Figure 15:
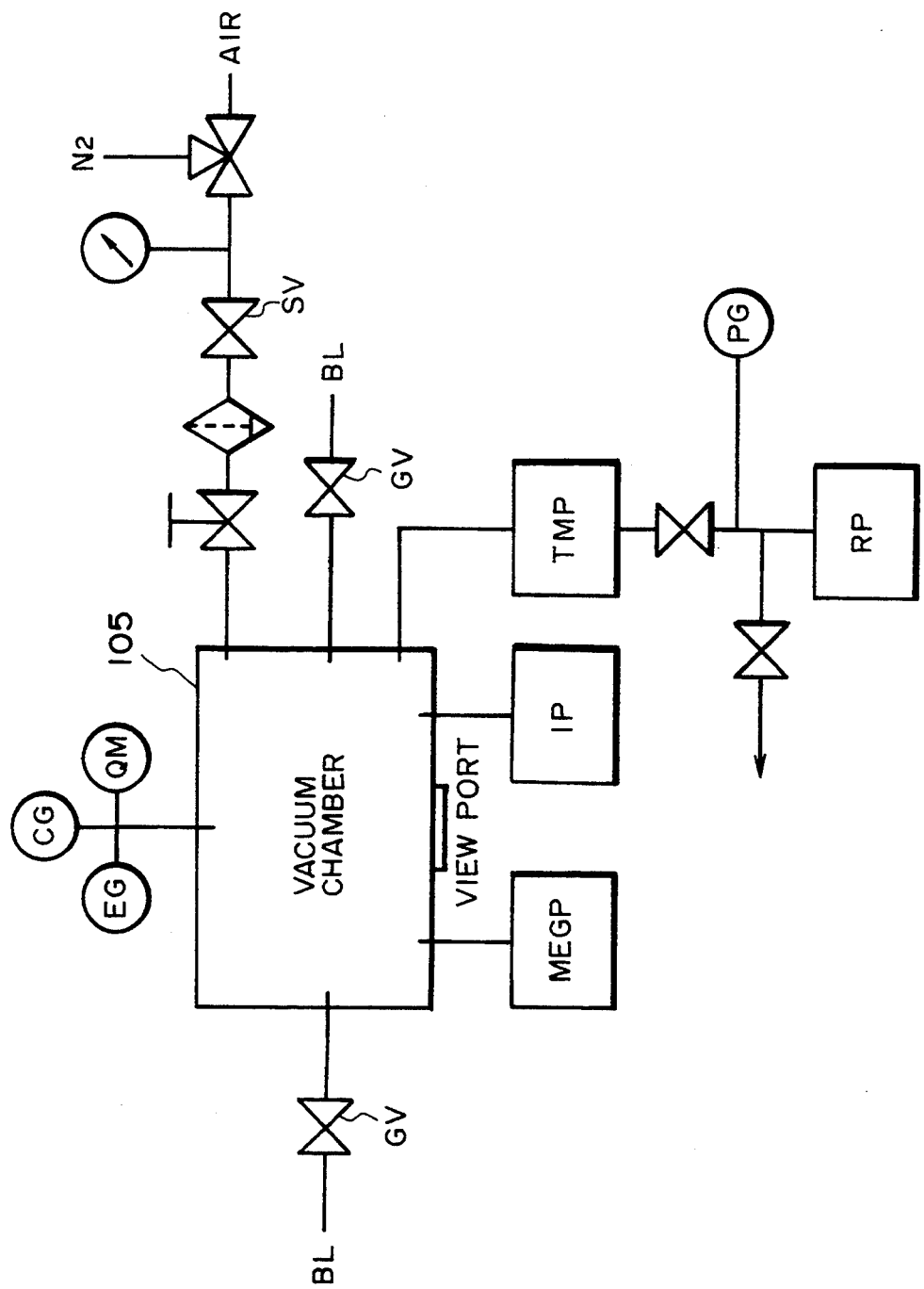
FIG. 15 is a diagrammatic view of a vacuum evacuation system.

The vacuum evacuation system is such as shown in FIG. 15. Below the vacuum chamber 105, there are provided a non-vacuum deposition type getter pump (NEG pump) and an ion pump for attaining a pressure not higher than $10^{-9}$ (Torr). Also, as shown in FIG. 2, a view port 909 is formed at the center of the bottom surface of the vacuum chamber 105, for allowing direct observation of the mirror 101 when the SR X-rays are introduced. For direct measurement of the attitude of the mirror 101, an autocollimator can be mounted.

To the right side of the vacuum chamber 105 as seen from the SOR ring, a primary vacuum applying system is connected. More particularly, a turbo molecular pump TMP and a rotary pump RP are connected to this side. A Pirani gauge PG is interposed between the turbo molecular pump and the rotary pump. On the opposite side, an ion gauge EG and a vacuum potentiometer QG can be mounted. Also, on the back side, leakage piping means is connected. The connection is in the order of a port, a stop valve, a filter, a safety valve, a three-way valve, nitrogen and air. The filter serves to prevent contamination of the inside of the vacuum chamber due to impurities contained in the nitrogen or air. The safety valve serves to prevent a pressure increase in the vacuum chamber beyond the atmospheric pressure.

An electric system for controlling the driving motors and the pumps is accommodated in a rack. At least the attitude controlling system is demountably mounted, and the position of the mirror can be controlled by remote control. By disposing the operating means outside a radiation shield wall and by handling the operating means disposed outside the radiation shield, it is possible to avoid exposure of an operator to the SR X-ray radiation.

For connection to the SOR ring or for prevention of contamination of the mirror by the SR X-rays, it is necessary to maintain ultra-high vacuum within the vacuum chamber. To this end, at the time of starting practical use of the apparatus, a baking operation may be required. If a heating means is mounted to the outside wall of the vacuum chamber 105 and the vacuum chamber is heated by this heating means, there is a possibility of causing damage of such portion not resistive to heat, as the ball screw portion of the y-axis driving system, for example. In consideration of this, at the time of the baking operation, the cooling water may be flown through the passageways in the mirror y-axis driving system and the shutter driving system to thereby protect the driving means.

Figure 16:
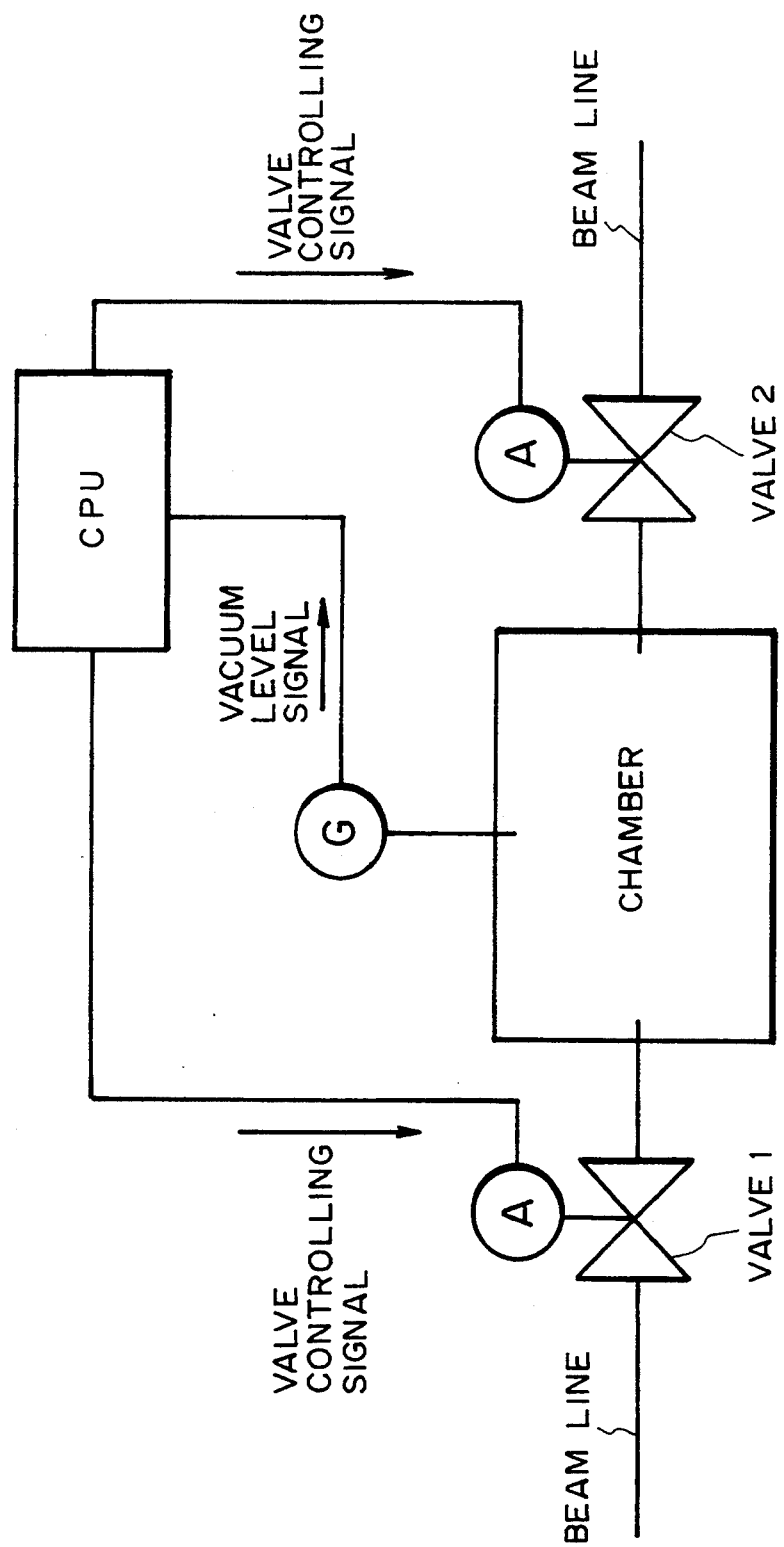
FIG. 16 is a block diagram of a pressure controlling circuit.

The SR X-rays are introduced into the vacuum chamber during the normal operation, and there is a possibility that any gas absorbed in a metal or the surface of the mirror is excited and released to deteriorate the vacuum level. If the SR X-rays impinge on the mirror when the vacuum level is low, contamination may occur. Also, the decrease in vacuum level has an adverse effect on the SR light source. In order to prevent this, two gate valves provided at the front and rear beam ports, communicated with the vacuum chamber, are automatically closed when the vacuum level in the vacuum cheer becomes lower than $10^{-9}$ (Torr) (FIG. 16). More specifically, the vacuum level is measured by means of a vacuum gauge mounted To the vacuum chamber, and the measured value is continuously transmitted to a central processing unit CFU. If the vacuum level becomes lower than the level $10^{-9}$, the CPU supplies an instruction signal to actuators of the valves 1 and 2 to close them. In this manner, the inside of the vacuum chamber is isolated from The beam line, and simultaneously the impingement of SR X-rays to the mirror is stopped. By this, the gas release from the mirror can be prevented and contamination can be avoided.

With the arrangement of the present embodiment as described above, the attitude of the reflection surface of the mirror relative to the path of the SR X-ray beam can be adjusted while monitoring its relative position. Therefore, it is possible to adjust the mirror attitude very easily and very precisely. Also, the structure can be made simple and small in size, leading to reduction in cost.

Next, another embodiment of the present invention will be explained. The general arrangement of this embodiment is similar to that illustrated FIG. 1.

Figure 17:
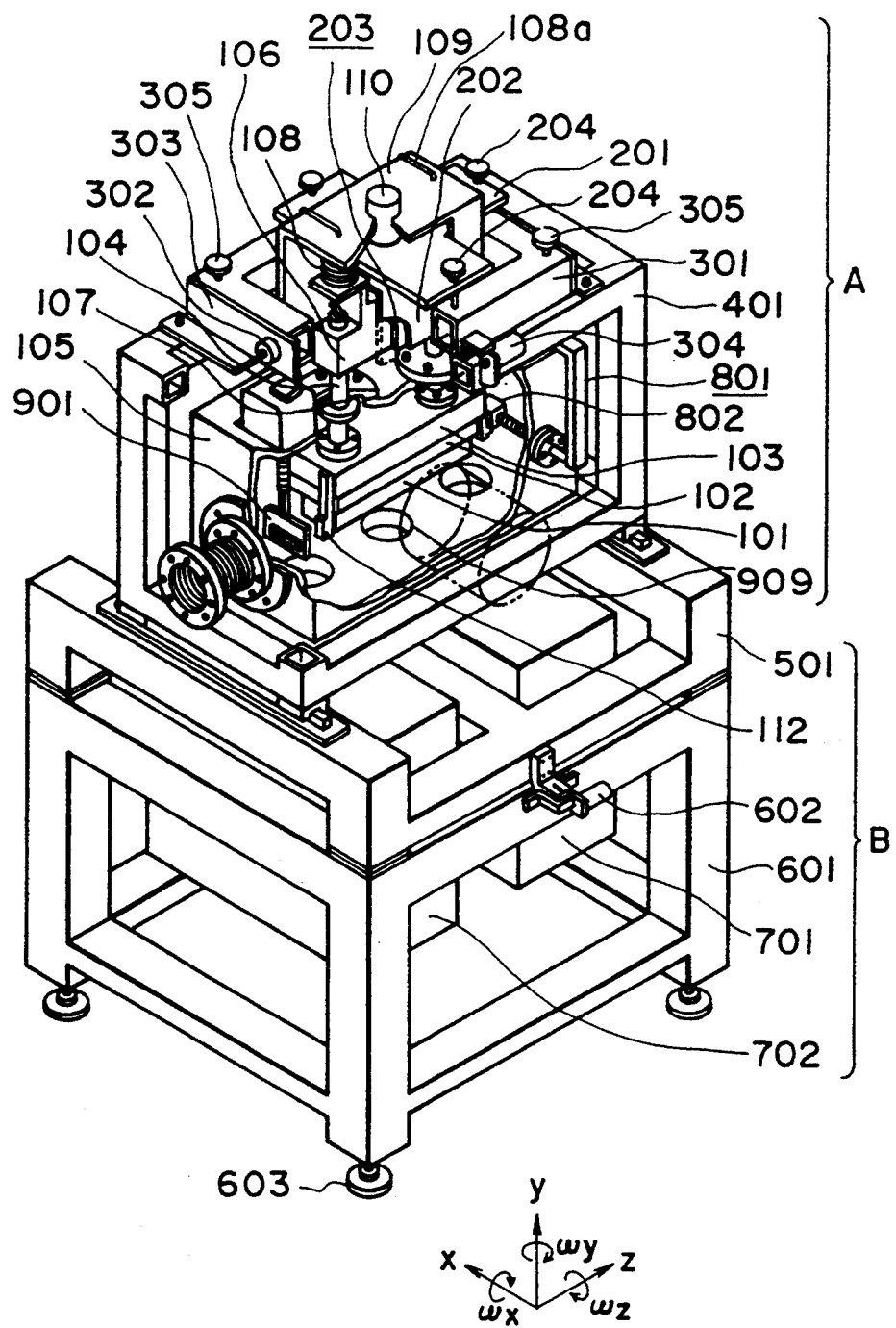
FIG. 17 is a perspective view of a mirror unit according to a third embodiment of the present invention.
Figure 18:
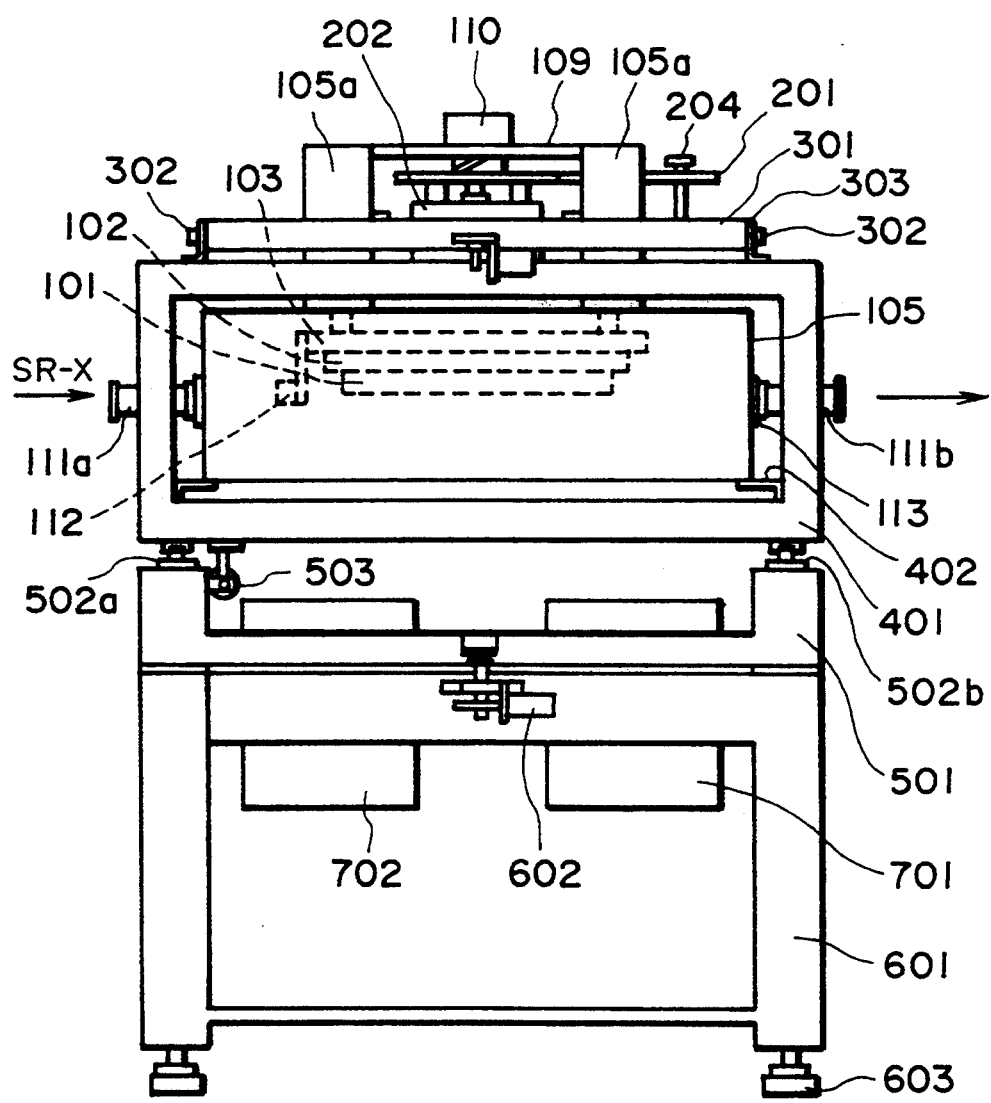
FIG. 18 is a side view of the mirror unit of the third embodiment.

FIG. 17 is a partially broken perspective view showing details of the mirror unit of this embodiment, and FIG. 18 is a side view thereof wherein a detector unit and a shutter unit are demounted. The same reference numerals as those of FIGS. 2 and 3 are assigned to corresponding elements.

Convex mirror 101 having a facing-down reflection surface defined by a partial cylindrical surface is held by a mirror holder 102 which is mountably and demountably fixed to a holder supporting plate 103. The plate 103 is fixed to a lower end of a mirror supporting rod (coupling means) 104 which extends through an opening of a vacuum chamber 105 and is connected to a mirror support 106 disposed above the chamber 105. Shutter unit 5 disposed adjacent to an end of the mirror 101 has its driving means supported by an upper wall of the vacuum chamber 105. Bellows 107 is disposed between a peripheral portion of the opening of the vacuum chamber 105 and a flange portion of the mirror supporting rod 104. The rod 104 is tiltable and is movable, upwardly and downwardly, without damaging the vacuum ambience within the vacuum chamber 105. Namely, the clearance between the mirror support 104 and the opening of the vacuum chamber 105 is sealed by the bellows 107.

The vacuum chamber 105 is provided with beam connection bellows 111a and 111b at its opposite, sides, and these bellows are coupled to SR X-ray ducts (not shown), respectively, so as to introduce into the vacuum chamber the SR X-rays, emitted from the SOR ring to the irradiation chamber.

Figure 19:
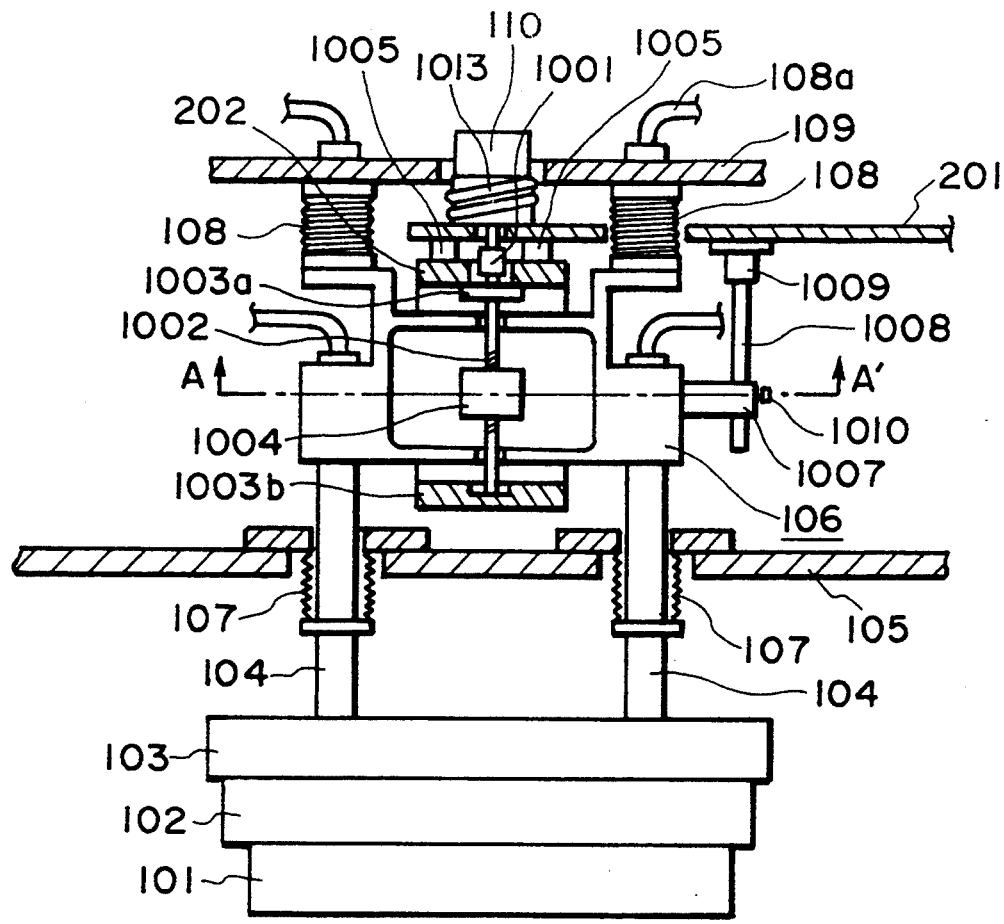
FIG. 19 is a fragmentary and side view of the mirror unit.

Counter bellows 108 has its lower end fixed to the upper portion of the mirror support 106. The upper end of the counter bellows 108 is fixed to the bottom surface of the top plate 109 which is integrally coupled to the vacuum chamber 105 through a wall plate 105a (FIG. 19). The inside space of the counter bellows 108 is reduced to a vacuum level by means of a vacuum pipe 108a which is communicated with a vacuum source.

The mirror support 106 can be moved reciprocally in a direction (y-axis direction) perpendicular to the reflection surface of the mirror 101 by means of a combination of a ball screw 1002, driven by a y-axis driving motor 110 (first driving means having a driving motor as a drive source), and a ball nut 1004 fixed to the housing 202. Tilt plate 201 is integrally fixed to a housing 202 which supports the mirror support 106 rectilinearly movably in the y-axis direction through the cooperation with a y-axis rectilinear guide 203. The tilt plate 201 is fixed to a flat reference frame 301 by means of three "wx and wz" adjusting screws 204, such that the direction and angle of the tilt of the tilt plate 201 relative to the reference frame 301 can be adjusted finely by the "wx and wz" adjusting screws 204.

The reference frame 301 is supported by a pair of bearing devices 302 disposed at the opposite ends thereof, rotatably around a longitudinal axis (z axis) of the mirror 101. Each bearing device 302 is fixed to a central part of an L-shaped rod 303 having its opposite ends mesh engaged to the top of a skeleton type main frame 401.

The rotating angle of the reference frame 301 around the z axis can be adjusted by a cam mechanism which is driven by a wz driving motor 304 (second driving means having a driving motor as a drive source. After such rotation adjustment, a locking screw 305 is fastened whereby the reference frame 301 is fixed relative to the main frame 401. Detector unit D is mountably and demountably provided in the forward end portion, along the z-axis direction, of the bottom surface of the reference frame 301.

The main frame 401 serves to support the bottom of the vacuum chamber 105 through the cooperation with a pair of L-shaped members (coupling means) 402. Each member 402 is made of a material having small rigidity and it serves to absorb deformation of the vacuum chamber 105 when its inside pressure is decreased from a normal pressure to a vacuum ambience pressure (e.g. about $10^7-10^{-10}$ (Torr)) to thereby prevent distortion of the main frame 401.

As illustrated in FIG. 18, the vacuum chamber 105 is held within the main frame 401 by means of the L-shaped members 402 fixed to the bottom of the main frame 401. On the other hand, the mirror 101 is supported by a mirror supporting device A comprising the tilt plate 201 and the reference frame 301, supported at the top of the main frame, through the mirror supporting rod 104.

Thus, the vacuum chamber 105 and the mirror supporting device A are coupled to the main frame through separate coupling members, respectively. As a result, it is possible to execute the y-axis position adjustment (y-axis adjustment) through the mirror 101 the mirror support 106, the rotational adjustment (wz adjustment) around the z axis through the reference frame 301 and the tilt adjustment (wx and wy adjustment) through the tilt plate 201, very precisely without being affected by the weight or deformation of the vacuum chamber 105. Also, the transmitting portions of these adjusting mechanisms can be made simple and small In size.

Any imbalance of pressure between the mirror support 106 and the mirror 101 disposed in the vacuum chamber 105 can be canceled by retaining the same vacuum level within the counter bellows 108 and, therefore, the power of the y-axis driving motor 110 and the wz driving motor 304 can be reduced.

Next, a supporting table structure B for supporting the main frame 401 will be explained. The supporting table structure B comprises an upper table 501 of flat frame shape and a lower table 601 of skeleton frame shape. The main frame 401 is movable reciprocally in the transverse direction (x-axis direction) of the mirror 101, along a pair of x-guide rails 502a and 502b provided on the upper table 501. The movement of the main frame 401 in the x-axis direction is provided by manually rotating an x-axis feeding screw 503 mounted on the upper table 501.

The upper table 501 is supported on the lower table 601 rotatably around its vertical central axis (y axis). The rotating angle around the y axis can be adjusted by a cam mechanism which is driven by a wy driving motor means 602 (third driving means having a driving motor as a drive source). The lower table 601 has legs 603, the length of each of which can be adjusted to adjust the direction and the angle of tilt of the lower table, i.e., the tilt of the supporting table structure B and the main frame 401 relative to the floor surface. Ion pump 701 and NEG pump 702 are disposed in the inside of the supporting table structure B (comprising the upper and lower tables 501 and 601) and just below the vacuum chamber 105.

Next, the process of initial positioning prior to execution of the exposure operation will be explained.

After the tilt adjustment using the kegs 603 of the lower table 601 and the "x" adjustment of the main frame 401 using the feed screw 503, the pressure in the vacuum chamber 105 is reduced and the beam connecting bellows 111a and 111b are coupled to the SR X-ray beam ducts (not shown). In this state, the tilt adjustment using the legs 603 of the lower table is carried out again, to thereby set the reflection surface of the mirror 101 at a predetermined reflection angle.

After a radiation shielding wall (not shown) is set, the SR X-rays are introduced into the vacuum chamber and the detector unit D is used to detect any positional deviation between the SR X-ray beam and the reflection surface of the mirror 101 with respect to the wy and wz directions. On the basis of the detection, the rotational adjustment of the upper table 501 using the wy driving motor 602 and the rotational adjustment of the reference frame 301 using the wz driving motor 304 are carried out. Finally, by using the X-ray position sensor 112, the positional deviation of the mirror reflection surface in the y-axis direction is detected, and the y-axis driving motor 110 is actuated to execute the y-axis adjustment of the mirror support 106. The mirror support 106 is then fixed to the tilt plate by a locking device (to be described later).

After completion of such initial positioning, the detector unit D is demounted and the exposure operation is initiated.

Figure 26:
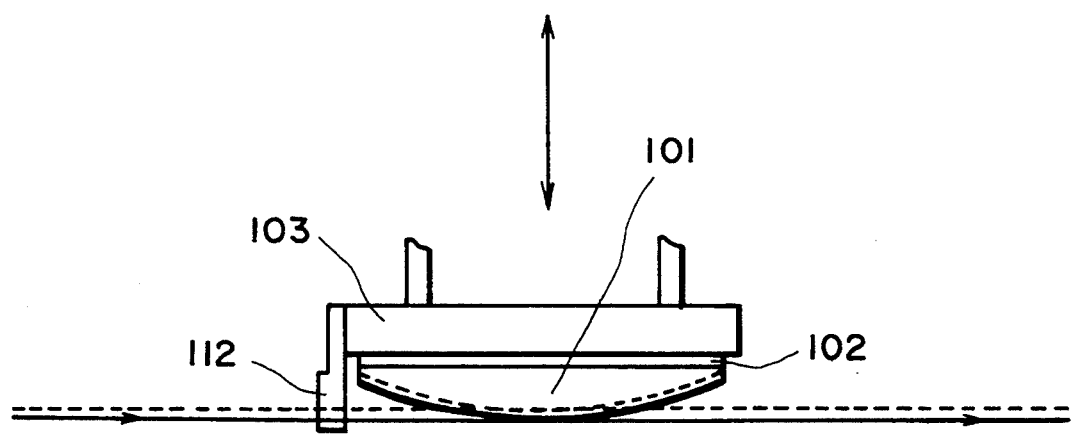
FIG. 26 is a schematic view for explaining the position control of the mirror.

If the relative position of the SR X-ray and the reflection surface of the mirror 101 in the y-axis direction changes during the exposure operation due to vibration, a change in temperature or fluctuation of the SR X-ray beam, the locking mechanism of the mirror support 106 is released and the y-axis driving motor 110 is actuated in response to the output of the X-ray position sensor 112 to move the mirror 101 in the y-axis direction (denoted by an arrow) (FIG. 26).

Figure 27:
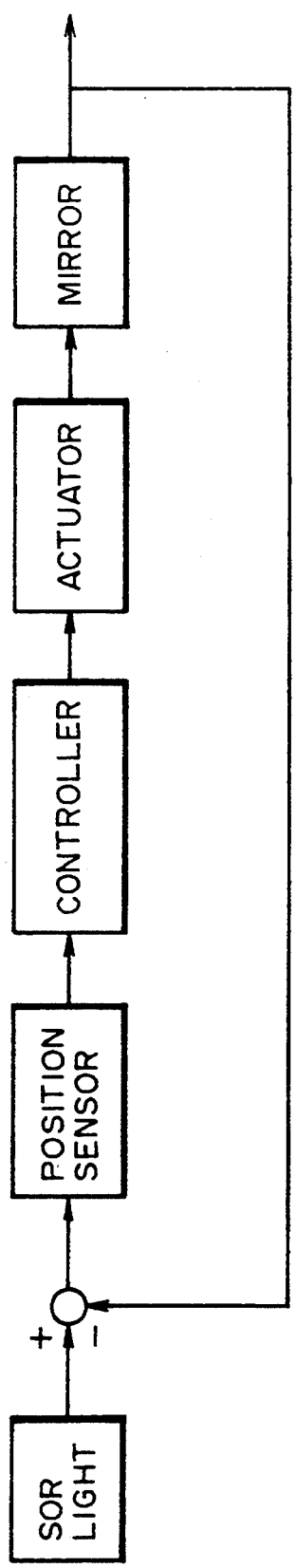
FIG. 27 is a block diagram of a control circuit.

After removing the non-uniformness in illuminance in the exposure region of a wafer in this manner, the mirror support 106 is held fixed again by the locking device. The control circuit for the y-axis driving motor 110 is such as illustrated in FIG. 27.

If the mirror reflection surface is damaged seriously by X-rays, the feed screw 503 may be rotated manually to displace the mirror in the widthwise direction. This allows using a fresh reflection surface area and enables continued exposure operation without replacing the mirror. Thus, the whole width of the mirror can be utilized.

For the mirror replacement, the mirror 101 is replaced together with the mirror holder 102. Then, only through the adjustment of the tilt of the tilt plate 201 using the "wx" and "wz" adjusting screws 204, the positioning of a fresh mirror can be attained.

Next, the structures of the mirror support 106, the tilt plate 201, the reference frame 301, the main frame 401 and the upper and lower tables 501 and 601 will be explained in detail.

(1) Mirror Support

Figure 20:
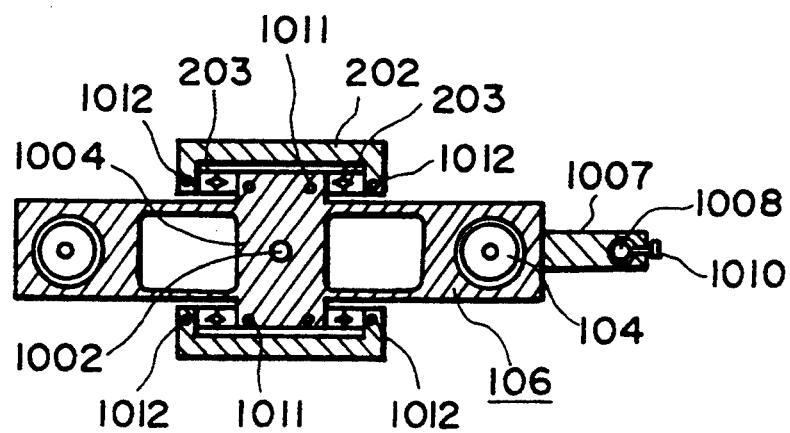
FIG. 20 is a fragmentary and sectional view of the mirror unit.

As illustrated in FIGS. 19 and 20, the y-axis driving motor has its rotational shaft coupled to a ball screw 1002 through a coupling 1001, The ball screw 1002 is, at its opposite end portions, rotatably supported by a radial bearing 1003a and a thrust bearing 1003b which are integral with the housing 202.

The ball screw 1002 has a screw portion formed at its center which is mesh engaged with a ball nut 1004 formed at the central rod-like portion of the mirror Support 106. In response to actuation of the y-axis motor 110, the ball screw 1002 rotates to move the ball nut 1004 upwardly or downwardly. This causes the mirror support 106, integral with the ball nut 1004, along the y-axis direction. The housing 202 is fixed to the tilt plate 201 by means of four connecting plates 1005, and the fine adjustment in the wx and wz directions can be effected by this tilt plate 201. The y-axis rectilinear guide 203 which serves as the guide means for rectilinearly movably supporting the mirror support 106, comprised four y-axis rectilinear guides 203 which are disposed between the housing 202 and the opposite ends of the central rod-like portion of the mirror support 106. Each y-axis rectilinear guide 203 has sufficient rigidity such that, when the mirror support 106 moves in the y-axis direction with the ball nut 1004 in response to rotation of the ball screw 1002, side movement is prohibited and precise positioning is assured.

There is provided a locking device for locking the mirror support 106 relative to the tilt plate 201 in response to setting a fresh y-axis position of the mirror support 106 through the drive of the y-axis driving motor 110. This locking device comprises a rod clamp 1007, a locking rod 1008, a rod support 1009 and a locking bolt 1010. After the mirror support 106 is moved to a fresh y-axis position, the locking bolt 1010 is fastened to lock the mirror support at that position.

Additionally, there is provided cooling means for preventing degradation of dimensional precision due to heat generation in the y-axis driving motor. This cooling means comprises a cooling medium flow passageway 1011 disposed adjacent to the sliding shaft portion of the mirror support 106 and a cooling medium flow passageway 1012 provided to the y-axis rectilinear guides 203 of the housing. By means of the cooling medium supplied from a cooling water pipe 1013, any temperature rise in the mirror support 106, the y-axis rectilinear guides 203 and the housing 202 can be prevented.

The cooling means may be used also as means for preventing thermal damage of the y-axis rectilinear guide 203 and the structural portion around it during the baking process in a case where such a baking process is required so as to improve the vacuum level of the vacuum chamber prior to execution of the exposure operation.

The mirror supporting rod 104 held by the mirror support 106 is inserted into the vacuum chamber 105 through the opening where the bellows 107 is provided. The holder supporting plate 103 for mountably and demountably holding the mirror holder 102, is fixed to the lower end of the mirror supporting rod 104. Disposed at the upper end of the mirror support 106 is a counter bellows 108 which is provided between it and the top plate 109, coupled integrally with the vacuum chamber 105 by a partition wall 105a. The counter bellows 108 has the same diameter or cross-sectional area as the bellows 107. The inside pressure of the counter bellows 108 is reduced to a vacuum level by means of a vacuum pipe 108a, whereby any pressure imbalance to be applied to the mirror support 106 can be removed such that any degradation of precision of the y-axis position due to a change in atmospheric pressure can be prevented. Also, it has an advantage of reducing the driving force of the y-axis driving motor 110.

(2) Tilt Plate

As described, the tilt plate 201 is fixed integrally to the housing 202 and supports the y-axis rectilinear guide 203. It comprises a T-shaped plate-like member and, as shown in FIG. 21, it is fixed to the reference frame 301 for free tilt adjustment, by means of the "wx" and "wz" adjusting screws 204 of plate-like members provided at three sites.

More specifically, each "wx" and "wz" adjusting screw 204 has a spherical sliding bearing 2001 which is held by a bearing housing 2002 provided at the opening portion of the tilt plate 201. Screw portion 203 provided at the lower end of the adjusting screw 204 is mesh engaged with a nut 2004 which is held at the top of the reference frame 301.

When the mirror 101 is replaced by a fresh mirror, together with the mirror holder 102, where the reflection surface of the mirror 101 is damaged by the X-ray exposure, the function of adjusting the tilt plate 201 through the "wx" and "wz" adjusting screw 204 is used for fine adjustment of the reflection angle or cancellation of a small positional deviation of the mirror reflection surface due to a machining error or assembling error of the fresh mirror or mirror holder.

(3) Reference Frame

The reference frame 301 has a flat frame shape having a central opening. As described, the reference frame is supported at the tope of the main frame 401 by means of the L-shaped rod 303, rotatably about the z axis. The housing 202 integral with the tilt plate 201, the y-axis rectilinear guide 203 and the mirror support 106 holding the mirror supporting rod 104 are suspended from the central opening of the reference frame 301 toward the vacuum chamber 105. For the initial positioning of the mirror 101, the detector unit D for sensing SR X-rays is demountably mounted to the bottom of the reference frame 301.

The reference frame 301 has a bearing device 302 which comprises ball bearing means 3001 and a rotational shaft 3002 disposed in the central portion of the L-shaped rod 303 (FIG. 22). The mechanism for rotating the reference frame 301, supported by the bearing device 302, around the z axis comprises an eccentric cam 3004 rotated by a wz driving motor 304 (FIG. 18) supported by a motor support 3003, a cam follower 3005, a supporting flange 3006 fixed-to the reference frame to support the cam follower 3005, and a spring 3007 for pressing the eccentric cam against the cam follower. Motor support 3008 for supporting the wz driving motor 304 is integral with the main frame 401 (FIG. 23). As the wz driving motor 304 rotates, the cam follower 3005 moves upwardly or downwardly with the rotation of the eccentric cam 3004, and the reference frame 301 rotates around the bearing device 302 through the supporting flange 3006. This is called "wz adjustment". Then, in this state, four locking screws 305 provided at the corners of the reference frame 301 are rotated so as to lock the reference frame. Each locking screw 305 has its screw portion 3009 mesh engaged with a locking nut 3010 which is integral with the reference frame 301, and its lower end extends beyond the bottom surface of the reference frame. By rotating the locking screws to cause their lower ends to engage with the top surface of the main frame, the relative position of the reference frame 301 and the main frame 401 is fixed.

(4) Main Frame

Figure 24A:
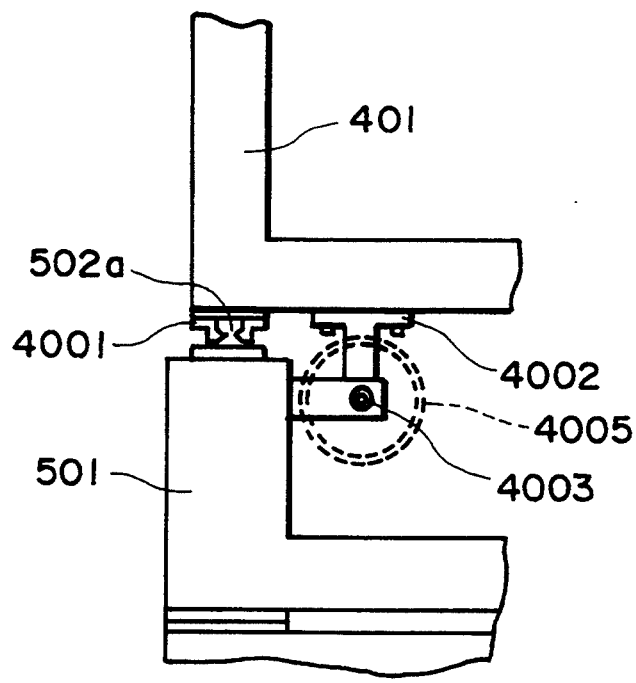
FIGS. 24A and 24B are fragmentary views, respectively, of the mirror unit.
Figure 24B:
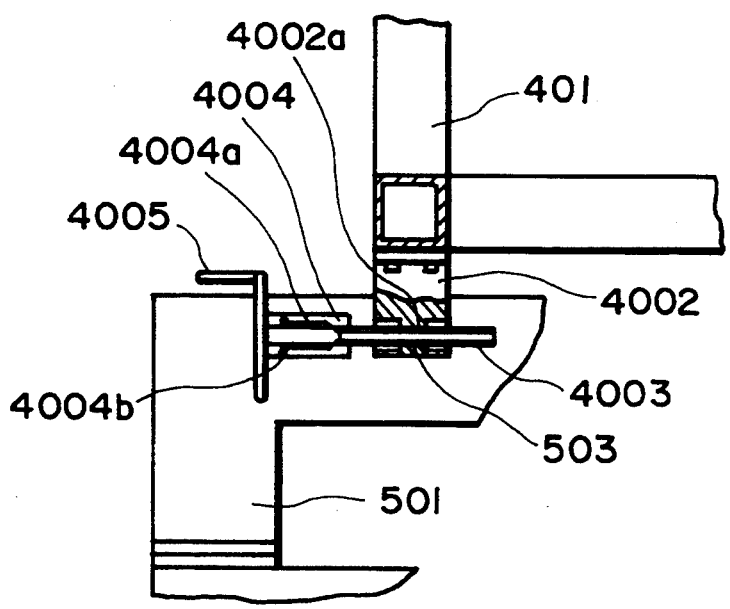
Figure 25:
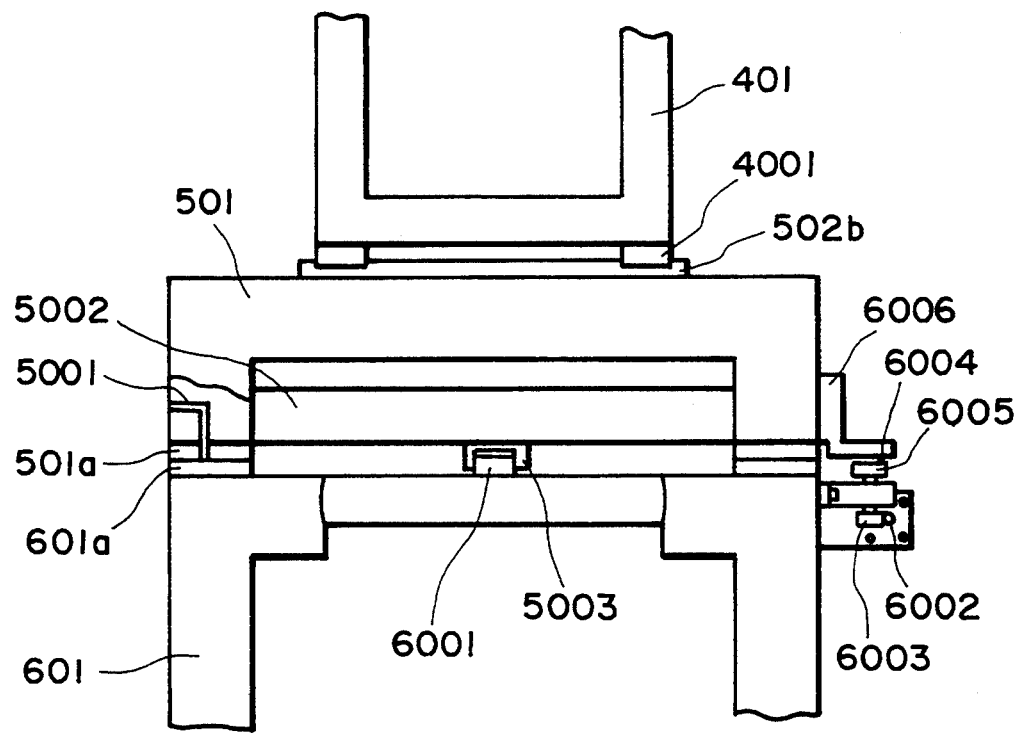
FIG. 25 is a schematic view of a portion of the mirror unit.

The main frame 401 rotatably supports the reference frame 301 through cooperation with the L-shaped rod 303 which is fixed to the top thereof. On the other hand, the main frame 401 supports the vacuum chamber 105 in its inside space through cooperation with the L-shaped member 402. The main frame 401 is supported on the upper table 501 for adjustment in the x-axis direction. More specifically, as shown in FIGS. 24A and 24B, a pair of guide groove members 4001 are formed at the opposite sides of the bottom surface of the main frame 401, and these guide groove menders slidably engage with x-axis guide rails 502a and 502b, respectively, provided on the top surface of the upper table 501. X-axis feed screw 503 for moving the main frame along the guide rails 502a and 502b comprises a screw rod 4003 engaging with a nut 4002a of a nut member 4002 which is fixed to the bottom surface of the main frame 401, and it is rotatably supported by a bearing 4004a of a supporting plate 4004 which is fixed to the upper table 501. Stoppers 4004b are provided at the opposite sides of the bearing 4004a, for preventing motion of the x-axis feed screw 503 in the x-axis direction. As the x-axis feed screw 503 is rotated by a handle 4005, the nut 4002a moves along the screw rod 4003 whereby the main frame 402 is moved along the x-axis guide rails 502a and 502b in the x-axis direction.

If the reflection surface of the mirror is damaged seriously by the X-ray exposure, it is possible to move the mirror reflection surface in its widthwise direction by moving the main frame in the x-axis direction, as described hereinbefore. Thus, without replacing the mirror, The X-ray exposure operation can be executed uninterruptedly while using a fresh reflection surface area. That is, until the whole width of the mirror is damaged, the reflection surface of the mirror can be used effectively.

(5) Upper Table

As described hereinbefore, the upper table 501 supports the main frame 401 movably in the x-axis direction along the x-axis guide rails 502a and 502b. The bottom of the upper table is rotatably supported on the lower table 601, for rotational adjustment around the y axis. As shown in FIG. 9, the engaging surfaces 501a and 601a of the upper and lower tables 501 and 601 have been subjected to high precision smoothing treatment and, by supporting the upper weight through the air supplied from a pressurized air pipe 5001, the rotation of the upper table 501 relative to the lower table 601 is allowed temporarily. The upper table 501 has a supporting plate 5002 fixed in the x-axis direction to its bottom surface, which plate holds a ring-like guide 5003 at its center. The guide 5003 rotatably engages with a pillar-like member 6001 projecting at the center of the upper surface of the lower table 601. Thus, as the upper table 501 is lifted slightly by the pressurized air from the lower table 601, the upper table 501 can be rotated around the pillar-like member 6001 of the lower table 601.

The mechanism for rotating the upper table 501 relative to the lower table 601 comprises a wy driving motor 602 (FIG. 17), a worm gear 6002 rotated by the wy driving motor 602, a worm wheel 6003, a disc 6005 with an eccentric cam 6004, and a cam follower 6006 having a radial slot for slidably engaging the eccentric cam 6004. As the wy driving motor 602 held by the lower table 601 rotates, the cam follower 6006 fixed to the upper table 501 rotates with the rotation of the eccentric cam 6004.

(6) Lower Table

As described, the lower table 601 supports the upper table 501 rotatably around the y axis. The lower table has four legs 603 at its lower end, and the length of each leg can be adjusted by means of a screw mechanism, for example. With this adjustment of the length of each leg, the lower table 601, namely, the whole apparatus, can be tilted in a desired direction relative to the floor surface (FIG. 17), More specifically, during the initial positioning of the mirror and after completion of the wy adjustment of the upper table, the x adjustment of-the main frame, the wz adjustment of the reference frame 301 and the wx and wz fine adjustment of the tilt plate (all being done in the horizontal state), the lengths of the legs 603 are adjusted to minutely rotate the lower table 601 around the x axis to set a desired mirror reflection angle (10–30 mrad). With such very simple adjusting mechanism, the reflection angle of the mirror can be set precisely.

With the arrangement of the present embodiment as describe above, it is possible to position the mirror very precisely without damaging the vacuum ambience in the vacuum chamber which accommodates the mirror for expanding the SR X-ray beam or without being affected by a change in pressure or deformation of the vacuum chamber, for example. Therefore, it is easy to attain uniform exposure amount in a predetermined region of a substrate and, as a result, it is possible to assure high precision printing of a fine pattern through the SR X-ray exposure. Also, the structure of the exposure apparatus as a whole can be made simple and compact, leading to reduction in cost.

Since the position adjustment of the mirror support, the reference frame and the upper table which needs irradiation of X-rays can be executed through remote control of driving motors, high safety is assured. Also, by canceling non-uniformness in illuminance due to vibration, a temperature change or fluctuation of the SR X-ray beam during the exposure operation, it is possible to print a pattern on the surface of a substrate (e.g. wafer) very precisely.

Additionally, it is possible to avoid damage or degradation of the precision of the mirror supporting device due to heat generation in the driving means or to heat transmission during the baking operation for the vacuum chamber.

Next, a fourth embodiment of the present invention will now be explained. The general arrangement of this embodiment is similar to that shown in FIG. 1.

Figure 28:
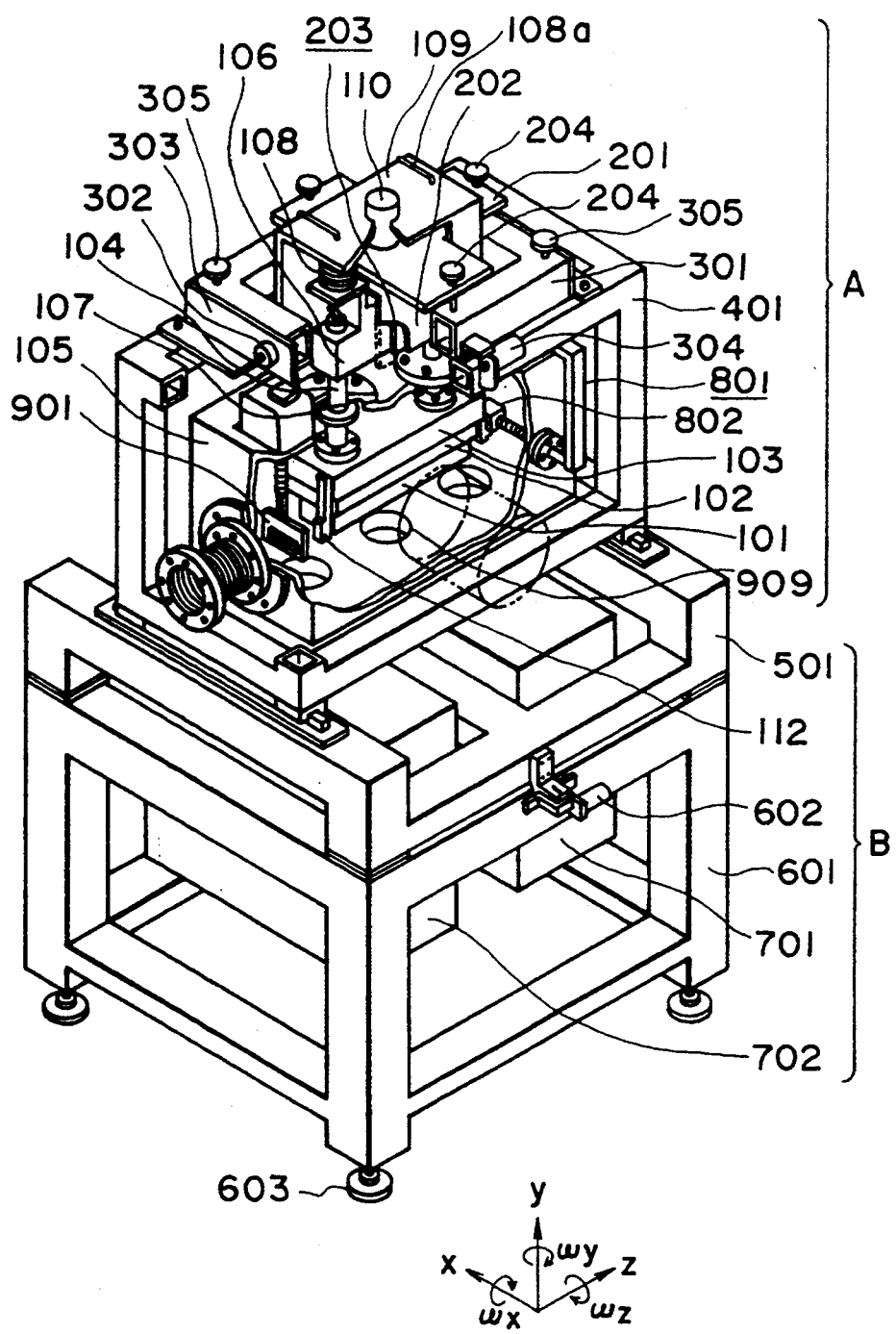
FIG. 28 is a perspective view of a mirror unit according to a fourth embodiment of the present invention.
Figure 29:
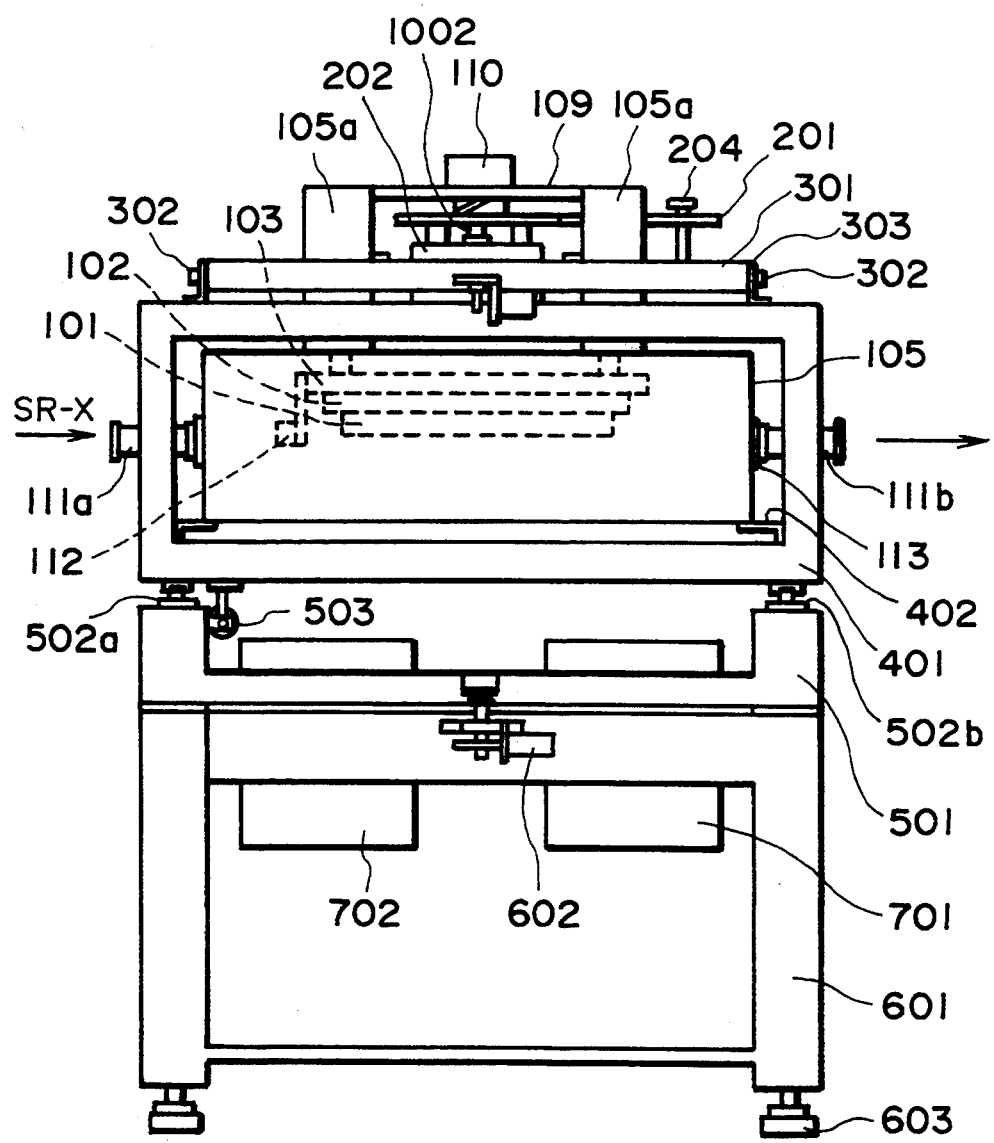
FIG. 29 is a side view of the mirror unit of the fourth embodiment.

FIG. 28 is a partially broken perspective view showing details of the mirror unit of this embodiment, and FIG. 29 is a side view thereof wherein a detector unit and a shutter unit are demounted. The same reference numerals as of those of FIGS. 2 and 3 are assigned to corresponding elements.

Convex mirror 101 having a facing-down reflection surface defined by a partial cylindrical surface, is held by a mirror holder 102 which is mountably and demountably fixed to a holder supporting plate 103. The plate 103 is fixed to a lower end of a mirror supporting rod 104 which extends through an opening of a vacuum chamber 105 and is connected to a mirror support (mirror supporting means) 106 disposed above the chamber 105. Shutter unit 801 disposed adjacent to an end of the mirror 101 has its driving means supported by an upper wall of the vacuum chamber 105. Bellows 107 is disposed between a peripheral portion of the opening of the vacuum chamber 105 and a flange portion of the mirror supporting rod 104. The rod 104 is tiltable and is movable, upwardly and downwardly, without damaging the vacuum ambience 105 within the vacuum chamber 105. Namely, the clearance between the mirror support 104 and the opening of the vacuum chamber 105 is sealed by the bellows 107.

The vacuum chamber 105 is provided with beam connection bellows 111a and 111b at its opposite sides, and these bellows are coupled to SR X-ray ducts (not shown), respectively, so as to introduce into the vacuum chamber the SR X-rays, emitted from the SOR ring to the irradiation chamber.

Figure 30:
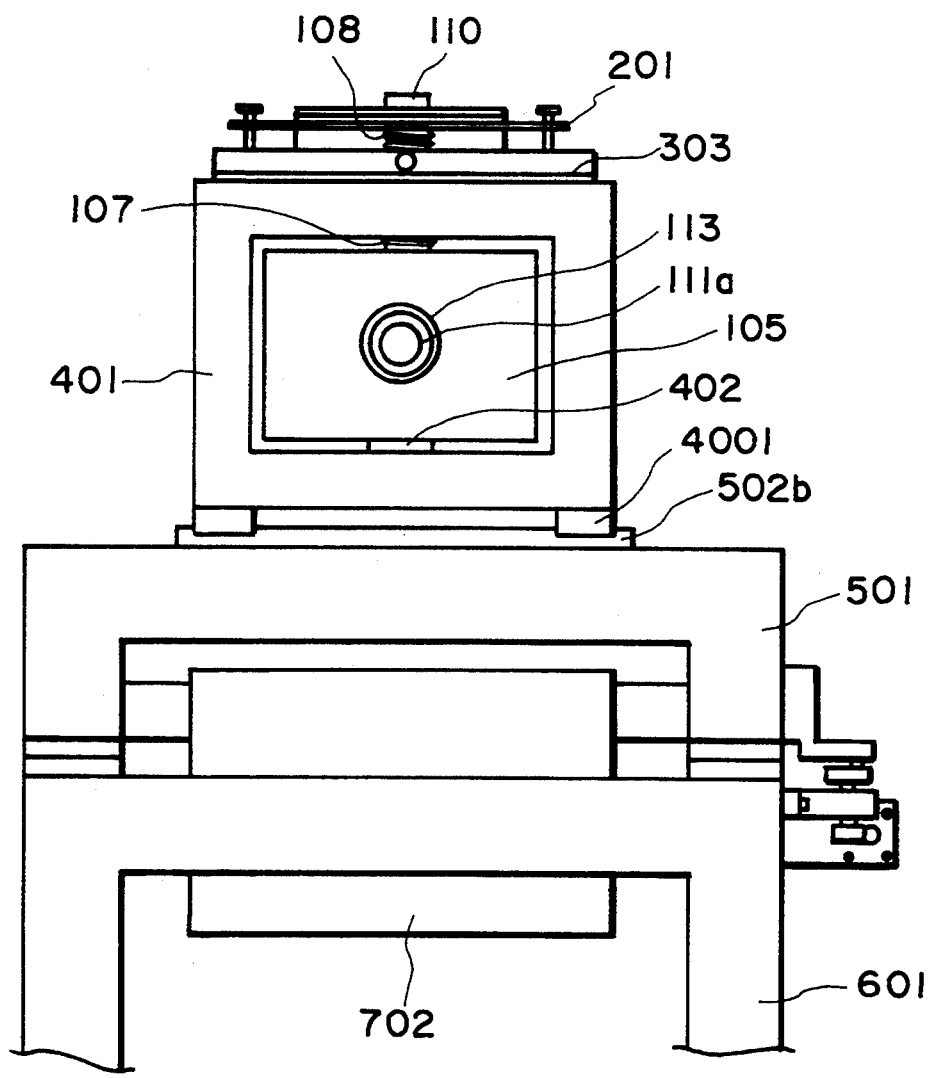
FIG. 30 is a fragmentary and side view of the mirror unit of the fourth embodiment.

Counter bellows 108, having the same cross-sectional area as the bellows 107, has its lower end fixed to the upper portion of the mirror support 106. The upper end of the counter bellows 108 is fixed to the bottom surface of the top plate 109 which is integrally coupled to the vacuum chamber 105 through a wall plate 105a (FIG. 30). The inside space of the counter bellows 108 is reduced to a high vacuum level by means of a vacuum pipe 108a which is communicated with a vacuum source.

The mirror support 106 can be moved reciprocally in a direction (y-axis direction) perpendicular to the reflection surface of the mirror 101 by means of a combination of a ball screw 1002 driven by a y-axis driving motor (first driving means) 110 and a ball nut (not shown) provided integrally with the mirror support 106. Tilt plate 201 is integrally fixed to a housing 202 which supports the mirror support 106 rectilinearly movably in the y-axis direction through the cooperation with a y-axis rectilinear guide 203. The tilt plate 201 is fixed to a flat reference frame 301 by means of three "wx and wz" adjusting screws 204, such that the direction and angle of the tilt of the tilt plate 201 relative to the reference frame 301 can be adjusted finely by the "wx and wz" adjusting screws 204.

The reference frame 301 is supported by a pair of bearing devices 302 disposed at the opposite ends thereof, rotatably around a longitudinal axis (z axis) of the mirror 101. Each bearing device 302 is fixed to a central part of an L-shaped rod 303 having its opposite ends mesh engaged to the top of a skeleton type main frame 401.

The rotating angle of the reference frame 301 around the z axis can be adjusted by a cam mechanism which is driven by a wz driving motor (second driving means) 304. After such rotation adjustment, a locking screw 305 is fastened whereby the reference frame 301 is fixed relative to the main frame 401. Detector unit D is mountably and demountably provided in the forward end portion, along the z-axis direction, of the bottom surface of the reference frame 301.

The main frame 401 serves to support the bottom of the vacuum chamber 105 through the cooperation with a pair of L-shaped members (coupling means) 402. Each member 402 is made of a material having small rigidity and it selves to absorb deformation of the vacuum chamber 105 when its inside pressure is decreased from a normal pressure to a vacuum ambience pressure (e.g. about $10^{-7}-10^{-10}$ (Tort)) to thereby prevent distortion of the main frame 401.

As illustrated in FIG. 29, the vacuum chamber 105 is held within the main frame 401 by means of the L-shape members 402 fixed to the bottom of the main frame 401. On the other hand, the mirror 101 is supported by a mirror supporting device (mirror supporting means) A comprising the tilt plate 201 and the reference frame 301, supported at the top of the main frame, through the mirror supporting rod 104.

Next a supporting table structure B for supporting the main frame 401 will be explained. The supporting table structure B comprises an upper table 501 of flat frame shape and a lower table 601 of skeleton frame shape. The main frame 401 is movable reciprocally in the transverse direction (x-axis direction) of the mirror 101 along a pair of x-guide rails 502a and 502b provided on the upper table 501. The movement of the main frame 401 in the x-axis direction is provided by manually rotating an x-axis feeding screw 503 mounted on the upper table 501.

The upper table 501 is supported on the lower table 601 rotatably around its vertical central axis (y axis). The rotating angle around the y axis can be adjusted by a cam mechanism which is driven by a wy driving motor means (third driving means) 602. The lower table 601 has legs 603, the length of each of which can be adjusted to adjust the direction and the angle of tilt of the lower table, i.e., the tilt of the supporting table structure B and the main frame 401 relative to the floor surface. Ion pump 701 and NEG pump 702 are disposed in the inside of the supporting table structure B (comprising the upper and lower tables 501 and 601) and just below the vacuum chamber 105.

Next, the moving mechanism for moving the main frame 401 in the x-axis direction will now be explained.

Figure 31A:
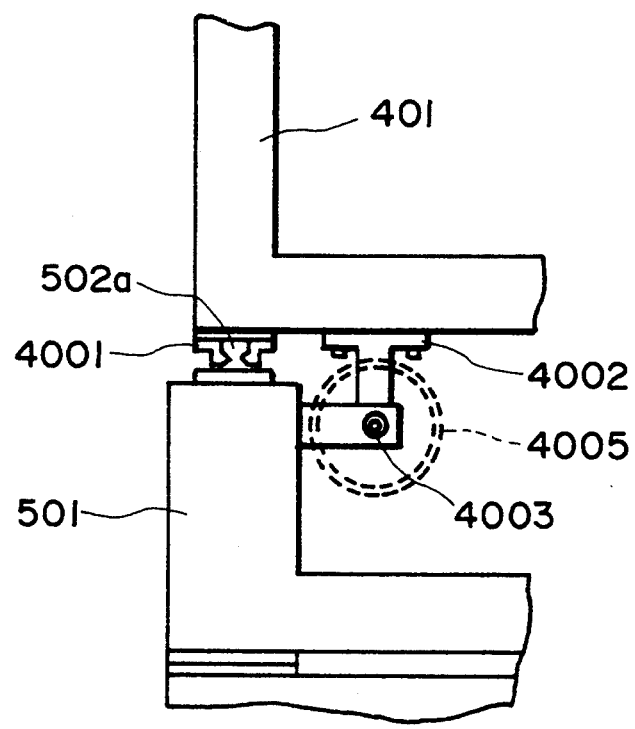
FIGS. 31A and 31B are fragmentary views of the mirror unit.
Figure 31B:
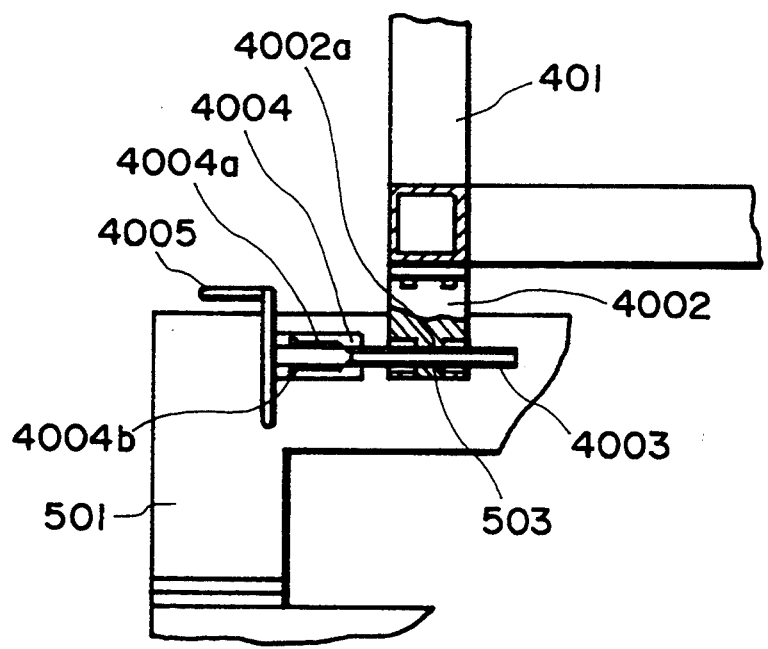

As shown in FIGS. 30 and 31, a pair of guide groove members 4001 are formed on the bottom surface of the main frame 401, and these guide groove members slidably engage with x-axis guide rails 502a and 502b, respectively, provided on the top surface of the upper table 501 which serves as table means. X-axis feed screw 503 for moving the main frame along the guide rails 502a and 502b comprises a screw rod 4003 engaging with a nut 4002a of a nut member 4002 which is fixed to the bottom surface of the main frame 401, and it is rotatably supported by a bearing 4004a of a supporting plate 4004 which is fixed to the upper table 501. Stoppers 4004b are provided at the opposite sides of the bearing 4004a, for preventing motion of the x-axis feed screw 503 in the x-axis direction. As the x-axis feed screw 503 is rotated by a handle 4005, the nut 4002a moves along the screw rod 4003 whereby the main frame 402 is moved along the x-axis guide rails 502a and 502b in the x-axis direction.

If the reflection surface of the mirror is damaged seriously by the X-ray exposure, it is possible to move the mirror reflection surface in its widthwise direction by moving the main frame in the x-axis direction, as described hereinbefore. Thus, without replacing the mirror, the X-ray exposure operation can be executed uninterruptedly while using a fresh reflection surface area. That is, until the whole width of the mirror is damaged, the reflection surface of the mirror can be used effectively.

Figure 32A:
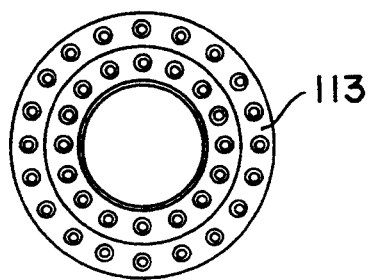
FIGS. 32A–32D are schematic views for explaining the structure of flange means.
Figure 32B:
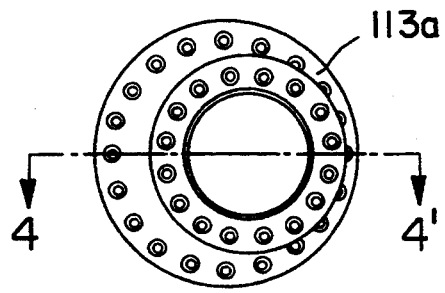
Figure 32C:
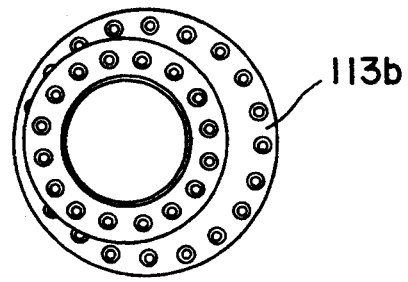
Figure 32D:

Since the movement of the main frame 401 causes displacement of the vacuum chamber 105 in the x-axis direction together with the mirror 101, there occurs positional deviation between the opening of the vacuum chamber 105 and the beam duct (not shown) for retaining vacuum ambience in the X-ray path. If this positional deviation is beyond such range ms can be absorbed by flexure of the beam connecting bellows 111a and 111b, the mounting flange 113 of each connecting bellows fixed to the periphery of the opening of the vacuum chamber 105 may be replaced by an eccentric flange 113a (FIG. 32B) or an eccentric flange 113b (FIG. 32C).

Each of these eccentric flanges 113a and 113b has opening and fixing means to the beam connecting bellows, at a position which is eccentric with respect to the opening of the vacuum chamber 105.

With the arrangement of the present embodiment as described above, the entire width of the reflection surface of the mirror can be used effectively by moving the mirror in its transverse axis direction together with the vacuum chamber. Therefore, the lifetime of each mirror can be prolonged and, thus, the frequency of mirror replacement can be reduced. Also, since it Is not necessary to adjust the mirror attitude again, the required operation is simple.

Next, a fifth embodiment of the present invention will be explained. The general arrangement of this embodiment is similar to that illustrated in FIG. 1.

Figure 33:
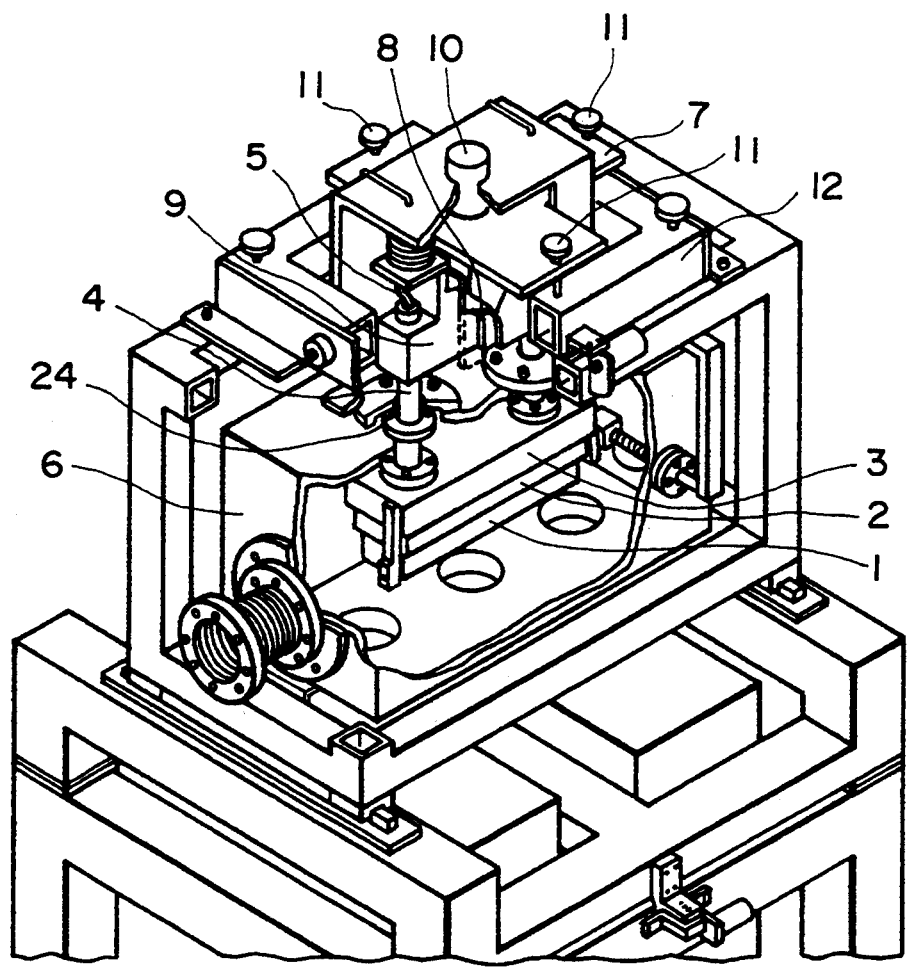
FIG. 33 is a perspective view of a mirror unit according to a fifth embodiment of the present invention.

FIG. 33 is a perspective view of a main portion of a mirror unit according to this embodiment. Mirror 1 is demountably held by a mirror holder 2 which is demountably fixed to a supporting plate (mirror supporting means) 3 with bolts (not shown). The supporting plate is fixed integrally to lower ends of a pair of supporting rods 4. Each rod 4 is provided by a hollow pipe member into which a mirror cooling water pipe 5 is inserted from the upper end of the rod 4. The water pipe 5 extends through the throughbore 3a (FIG. 35) of the supporting plate 3 and is communicated with a cooling medium passageway (to be described later) which is provided in the mirror holder 2.

The bottom surface of the mirror holder 2 has been subjected to high precision flattening treatment. Also, an indium film is interposed between it and the top surface of the mirror 1 to assure good heat transmission, ensuring enhanced mirror cooling effect. The mirror holder 2 and the supporting plate 3 are disposed inside a vacuum chamber 6, and the supporting rod 4 extends through an opening formed at the top wall of the vacuum chamber 6 and is connected to a supporting mechanism disposed outside the vacuum chamber. The supporting mechanism comprises a mirror support 9 which is reciprocally movable in a vertical direction along a guide 8 integral with the tilt plate 7, and a driving motor 10 for moving the mirror support 9 along the guide 8. The tilt plate 7 is mesh engaged with a reference frame 12 by means of three adjusting screws 11. By rotating these screws 11, the direction and the angle of tilt relative to the reference frame 12 can be adjusted.

The mirror holder 2 comprises a plate-like main member 14 with an inside cooling medium flow passageway 13, a pair of leaf spring supports 15 fixed to the bottom of the main member 14, and a plurality of leaf springs 16 fixed to the lower ends of the supports 15. The mirror 1 is supported with its reflection surface facing down, while being pressed against the main member 14 by the resilient forces of the leaf springs 16.

When the mirror is going to be mounted on the main member 14, the mirror position so adjusted that a straight line connecting two abutment members 17, for example, becomes parallel to the wy direction of the mirror 1 (namely, the direction of a minor line of a cylindrical surface) as seen from the rectilinearly guiding direction of the guide 8 (FIG. 33).

Figure 34A:
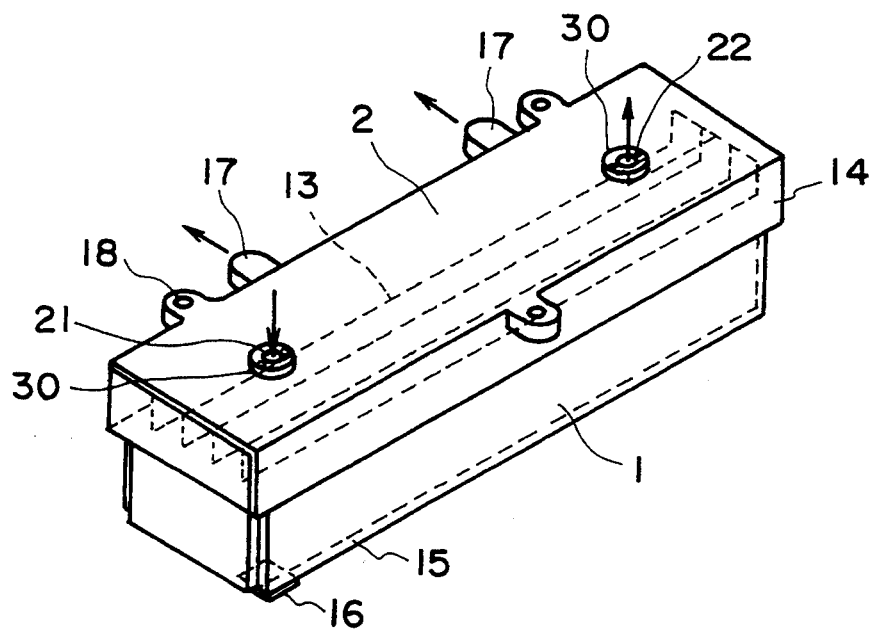
FIGS. 34A and 34B are fragmentary views of the mirror unit.
Figure 34B:
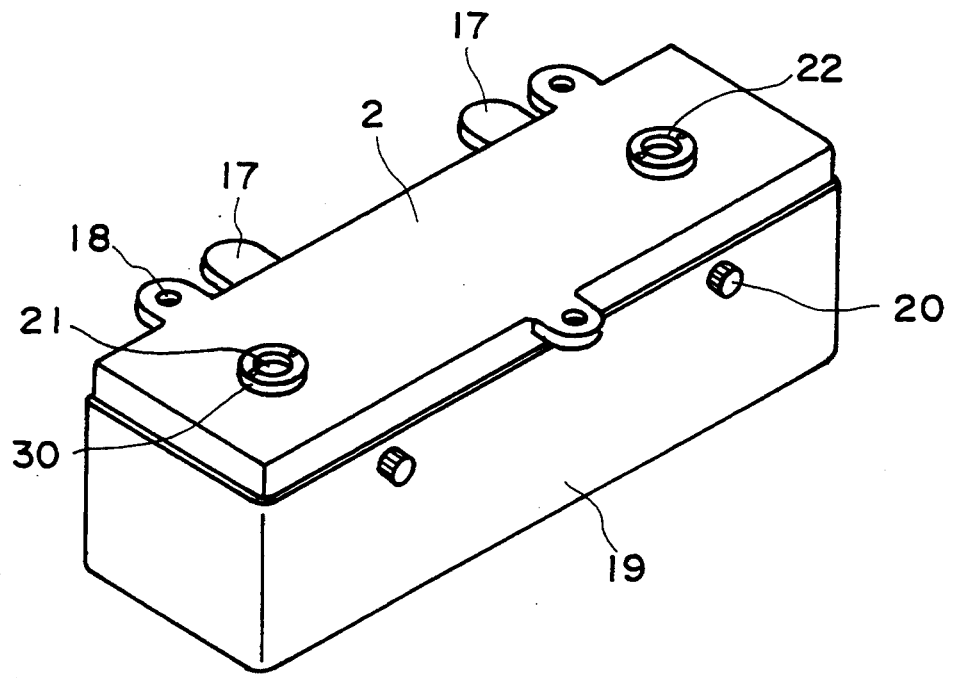

When the mirror holder 2 is going to be mounted to the supporting plate 3, the positioning is effected by abutting the abutment members 17 or the holder 2 against the abutment surface of the supporting plate 3. Here, pre-adjustment may be effected so that the direction of the abutment surface of the supporting plate 3 is aligned with the direction of the SR X-ray beam. Thus, by the abutment, the wy direction of the mirror can be aligned with the direction of the SR X-ray beam. After completion of such positioning, bolts are inserted into holes 18 to fix the mirror holder 2 and the supporting plate 3 to each other as described hereinbefore. During transportation of the mirror holder 2 holding the mirror 1 as well as during the operation for fixing the mirror holder 2 and the supporting plate 3 to each other in the described manner, a cover 19 (FIG. 34S) for protecting the mirror 1 may be attached To the mirror holder by using a screw 20, to thereby prevent damage of the mirror reflection surface.

The main member 14 of the mirror holder 2 has a supply port 21 and a discharging port 22 both communicated with the cooling medium flow passage means 13. After the mirror holder 32 is fixed to the supporting plate 3, the ends of the mirror cooling pipe 5 are coupled to the supply port 21 and the discharging port 22. In other words, the supply port 21 and the discharging port 22 each has a structure that allows connection of the mirror cooling pipe 5 thereto.

Next, the supporting plate 3 and the supporting rod 4 will be explained in greater detail.

Figure 35:
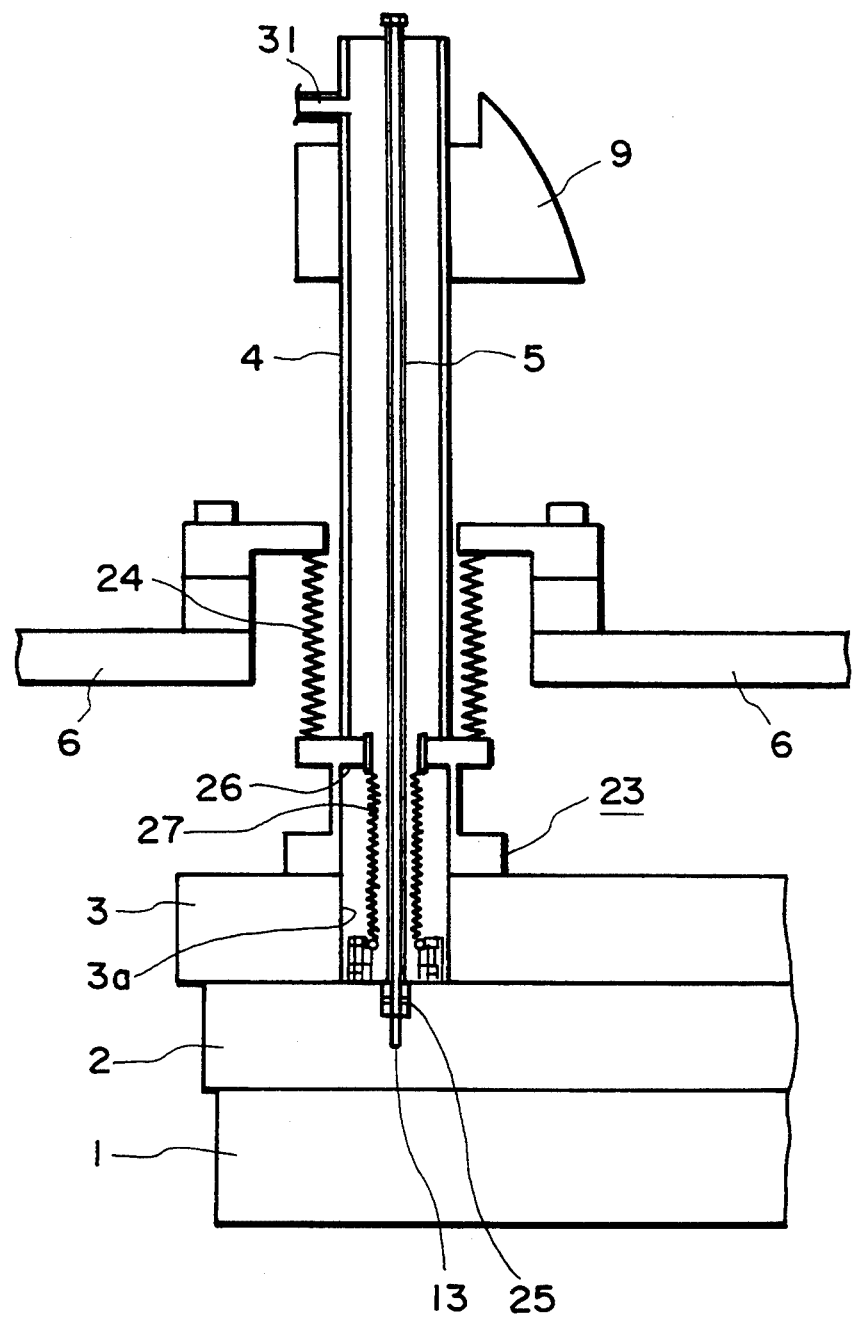
FIGS. 35 and 36 each is a fragmentary and sectional view of the mirror unit.

As illustrated in FIG. 35, the lower end of each supporting rod 4 is fixed to an end of a coupling member 23. The other end of the coupling member 23 is fixed integrally to the top surface of the supporting plate 3. Bellows 24 is provided between the coupling member 23 and the opening of the vacuum chamber 6, such that the supporting rod 4 can be tilted and moved up and down without damaging the vacuum ambience (e.g. about $10^{-7}-10^{-10}$ (Torr)) of the vacuum chamber 6. The enlarged-diameter lower end portion of the mirror cooling pipe 5 has an O-ring 25 held thereto. Into each of the supply port 21 and the discharging port 22 an O-ring 25 is inserted.

The coupling member 23 has an inside flange 26 projecting inwardly of the supporting rod. This flange 26 is connected to an end of an inside bellows 27. The inside bellows 27 has a bellows flange 28 at the other end thereof. The bellows flange 28 is connected to a holder flange 30 fixed to the peripheral portions of the supply port 21 and the discharging port 22 of the holder. The pressure in each of the inside space of the inside bellows 27 and the inside space of the supporting rod 4 is reduced to a low vacuum level, as compared with that in the vacuum chamber 6, by means of a vacuum pipe (not shown) connected to the discharging port. This assures improved reliability of maintaining the vacuum ambience in the vacuum chamber 6. That is, by evacuating the inside space of the supporting rod 4 in addition to the vacuum sealing through the inside bellows 27, the sealing effect is enhanced. Also, this provides an advantage of preventing leakage cooling water from the O-ring seal 25 into the vacuum chamber 6.

The operation of mounting and demounting the mirror holder 2 to and from the supporting plate 3 may be executed in the following manner.

Figure 36:
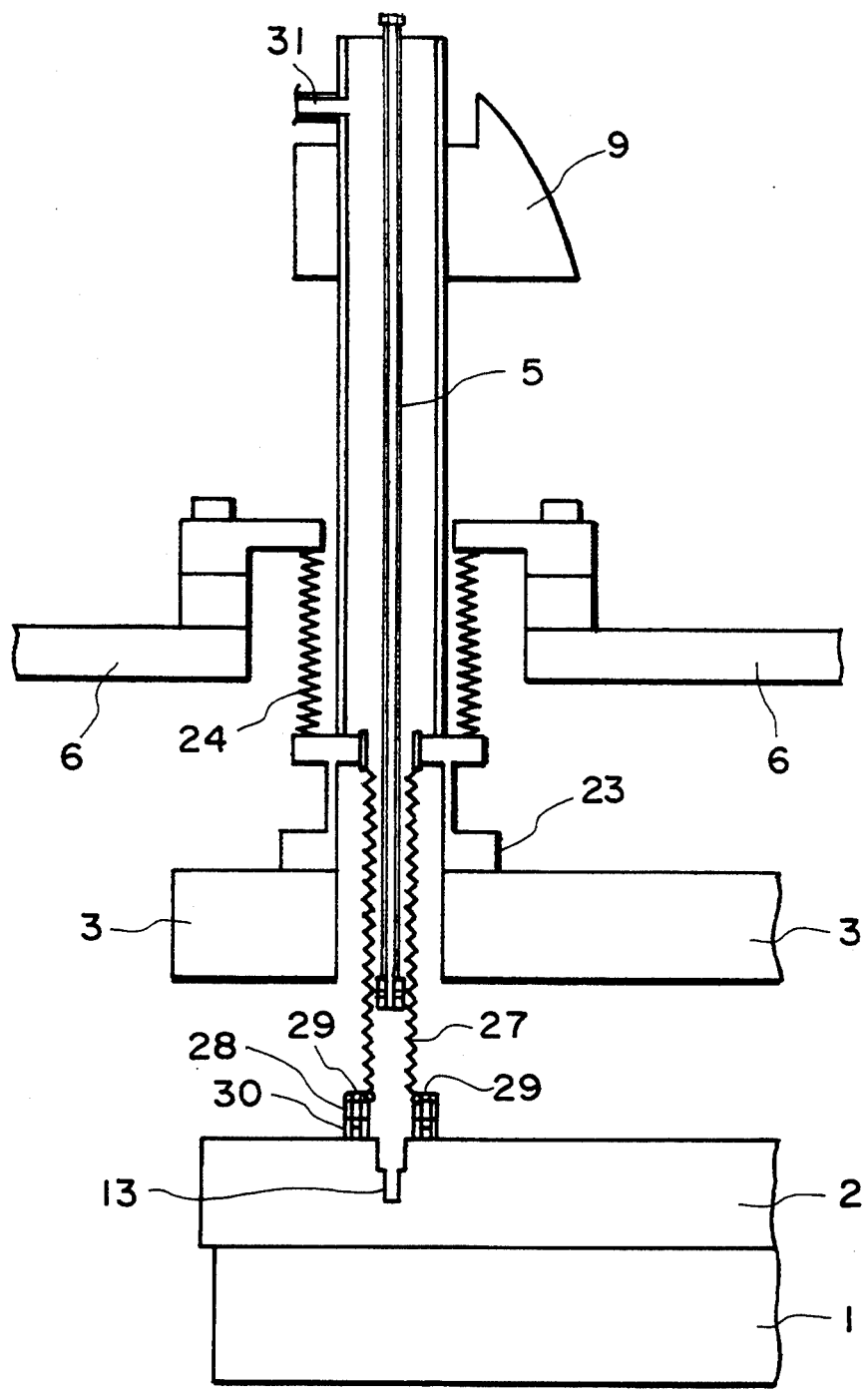

The mirror holder 2 with the lower surface of the mirror 1 being protected by the cover 19 is moved to a position below the Supporting plate 3, and the bellows flange 28 of the supporting plate is coupled to the holder flange 30 by using the bolts 29 (FIG. 36).

Subsequently, the mirror holder 2 is lifted toward the supporting plate 3 and it is positioned by engaging the abutment members 17 against the abutment surface of the supporting plate 3. Then, by using the bolts inserted into the holes 18, the mirror holder 2 and The supporting plate 3 are fixed to each other. After this, the cover 19 is demounted.

The mirror cooling pipe 5 is inserted into the supporting rod 4 from its top end. By engaging the O-rings at its free ends with the supply port 21 add the discharging port 22 of the mirror holder 2, the connection of the mirror cooling pipe 5 and the cooling medium flow passageway 13 of the mirror holder 2 is accomplished (FIG. 35).

For demounting the mirror holder 2, the bolts by which the mirror holder 2 is engaged with the supporting plate 3 are loosened. After this, the mirror holder 2 is moved downwardly and, subsequently, the bolts 29 are loosened to separate the bellows flange 28 from the holder flange 30.

As described, the mirror replacement can be executed by mounting and demounting the mirror holder 2, holding the mirror 1, to and from the supporting plate 3 by using bolts. Thus, the replacement operation is easy. Additionally, the positioning of the mirror to the supporting plate 3 is attainable through the abutment member 17 of the mirror holder 2. Thus, for the attitude adjustment after mirror replacement, only fine adjustment of a fresh mirror and a holder is necessary to cancel a machining error. Also, such fine adjustment can be accomplished only by adjusting again tile tilt of the tilt plate 7 through the adjusting screw 11. Further, the connection of the cooling medium flow passageway 13 of the mirror holder 2 with the cooling pipe 5 inserted into the supporting rod 4 can be assured easily only by press-fitting the O-ring 25 of the pipe 5 into the supply port 21 or the discharging port 22 of the mirror holder 2.

With the arrangement of this embodiment described above, the mirror replacement can be easily executed without damaging the reflection surface of a fresh mirror to be used in the vacuum chamber and without the necessity of complicated re-adjustment of position. Also, where the mirror holder is provided with a cooling medium flow passageway, a mirror cooling pipe can be connected thereto in the manner that assures a high reliability in respect to maintaining a vacuum ambience of the vacuum chamber.

Next, a sixth embodiment of the present invention will be explained. The general arrangement of this embodiment is similar to that illustrated in FIG. 1.

Figure 37:
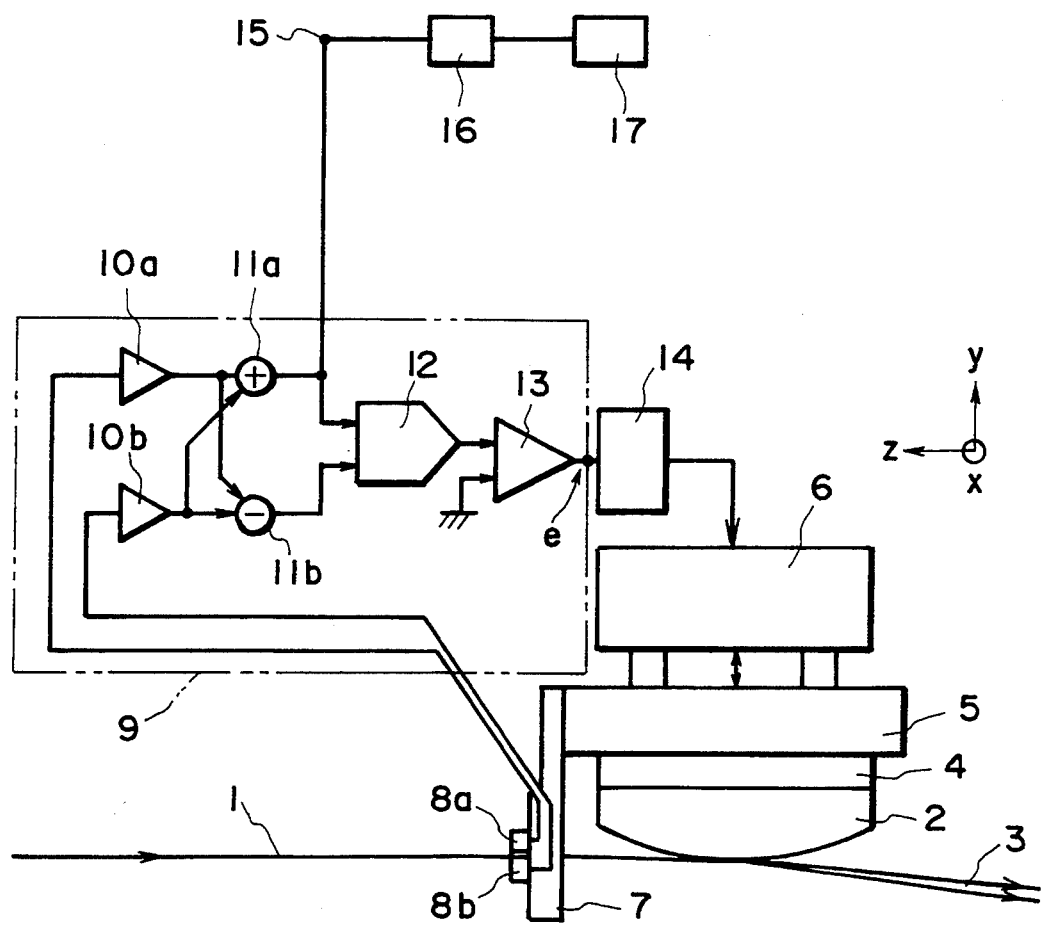
FIG. 37 is a schematic and diagrammatic view of the general arrangement of a sixth embodiment of the present invention.

FIG. 37 is a schematic view of this embodiment. SR X-ray sheet beam i is expanded by a mirror (cylindrical mirror) 2 in a direction perpendicular to the orbit of a SOR ring, whereby an expanded beam 3 is produced.

The cylindrical mirror 2 is held by a mirror holder 4 which is demountably supported by a holder supporting plate 5. The cylindrical mirror 2, the mirror holder 4 and the holder supporting plate 5 are disposed in a vacuum chamber (not shown) having a high inside vacuum ambience. Driving device 6 which serves as a mirror driving means for supporting the holder supporting plate 5 and moving the same in the y-axis direction is disposed outside the vacuum chamber.

Figure 38:
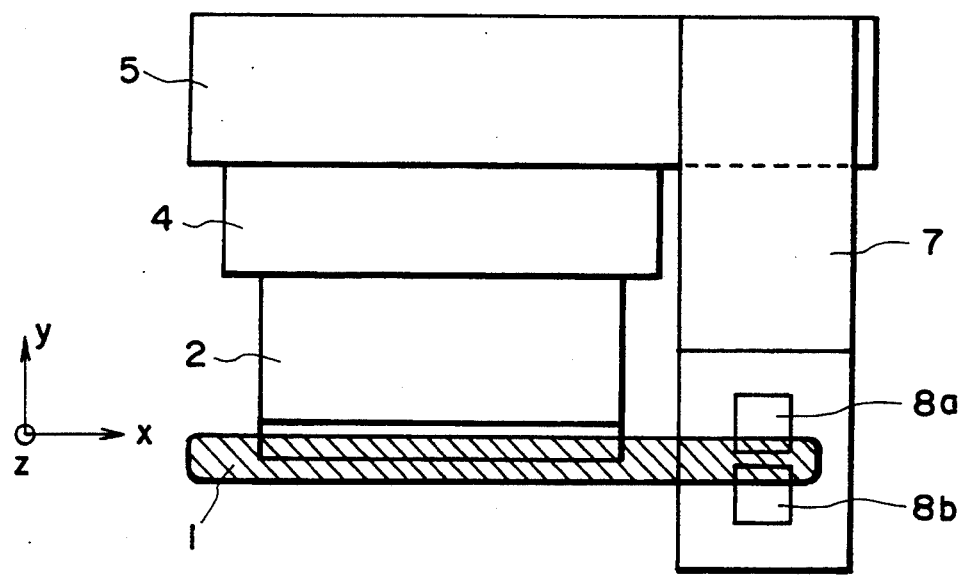
FIG. 38 is a schematic view of a portion of the sixth embodiment of the present invention.

Fixed to an end of the holder supporting plate 5 is a sensor holding member 7 which, as shown in FIG. 38, holds X-ray detectors (first and second X-ray detectors) $8a$ and $8b$ disposed in series in the y-axis direction. Each of the detectors $8a$ and $8b$ serves to detect X-rays in a predetermined region adjacent to the upper or lower edge $1a$ or $1b$ of the SR X-ray sheet beam, and it produces an output current or $1b$ proportional to the detected X-rays. As an example, a PIN diode made of a semiconductor material such as Si may be used as the X-ray detector $8a$ or $8b$.

The output currents Ia and Ib of the detectors $8a$ and $8b$ are applied to a control circuit (operation circuit) 9. The control circuit 9 comprises current-to-voltage converters $10a$ and $10b$ for transforming the output currents Ia and Ib into voltages Va and Vb, an adder $11a$ for adding the voltages Va and Vb, a subtractor $11b$ for subtraction of these voltages, a divider 12 for calculating the ratio $(Va-Vb)/(Va+Vb)$ of the outputs of the subtractor $11b$ and the adder $11a$, a comparator 13 for comparing the output of the divider 12 with a reference level, and a controller (control means) 14 for controlling the y-axis driving device 6 in accordance with an output "e" of the comparator 13.

More specifically, the output "e" of the comparator 13 is precisely in a proportional relationship with the relative positional deviation between the reflection surface of the cylindrical mirror 2 and the SR X-ray sheet beam, and the controller 14 controls the y-axis driving means 6 in accordance with the output "e" of the comparator 13 whereby the relative positional deviation can be canceled automatically.

On the other hand, the output of the adder $11a$ of the control circuit is applied from an output terminal 15 to an operation circuit 16 whereby a signal representing the X-ray strength is produced. This signal is used to control the shutter controlling means 17 of the shutter in an exposure chamber.

Since the relative position of the sheet beam 1 and the cylindrical mirror 2 is controlled automatically and is maintained unchanged, any displacement of the sheet beam 1 in the y-axis direction does not cause displacement of the light receiving surface of the X-ray detector $8a$ or $8b$ held integrally by the cylindrical mirror 2. Therefore, the output current of the detector $8a$ or $8b$ is not affected by the displacement of the sheet beam in the y-axis direction, but it is always held in a proportional relationship with the X-ray strength.

This means that the signal inputted to the operation circuit 16 is exactly in a proportional relationship with the X-ray strength and, therefore, it is possible to avoid a change in exposure amount of a substrate in the exposure chamber by controlling shutter control means 17 in accordance with the output of the operation circuit 16.

In place of applying to the operation circuit 16 the output signal of the adder 11a as a signal representing the X-ray strength, the shutter control means may be controlled on the basis of one of the outputs of the current-to-voltage converters 10a and 11b.

With the arrangement of this embodiment described above, the X-ray strength can be measured precisely without being affected by noise or displacement of the X-ray beam in the y-axis direction. As a result, it is possible to control the shutter means very precisely, in response to a change in the X-ray strength. Thus, uniform exposure of a substrate can be attained easily.

Also, there is no necessity of using an electrode plate in the exposure chamber, for measurement of the X-ray strength. Additionally, no high-voltage power source is required. This contributes to reduction in size of the exposure apparatus and to enhancement of safety.

Next, an embodiment of the present invention which is applied to a semiconductor device manufacturing method utilizing an exposure apparatus according to one of the preceding embodiments, will now be explained.

Figure 39:
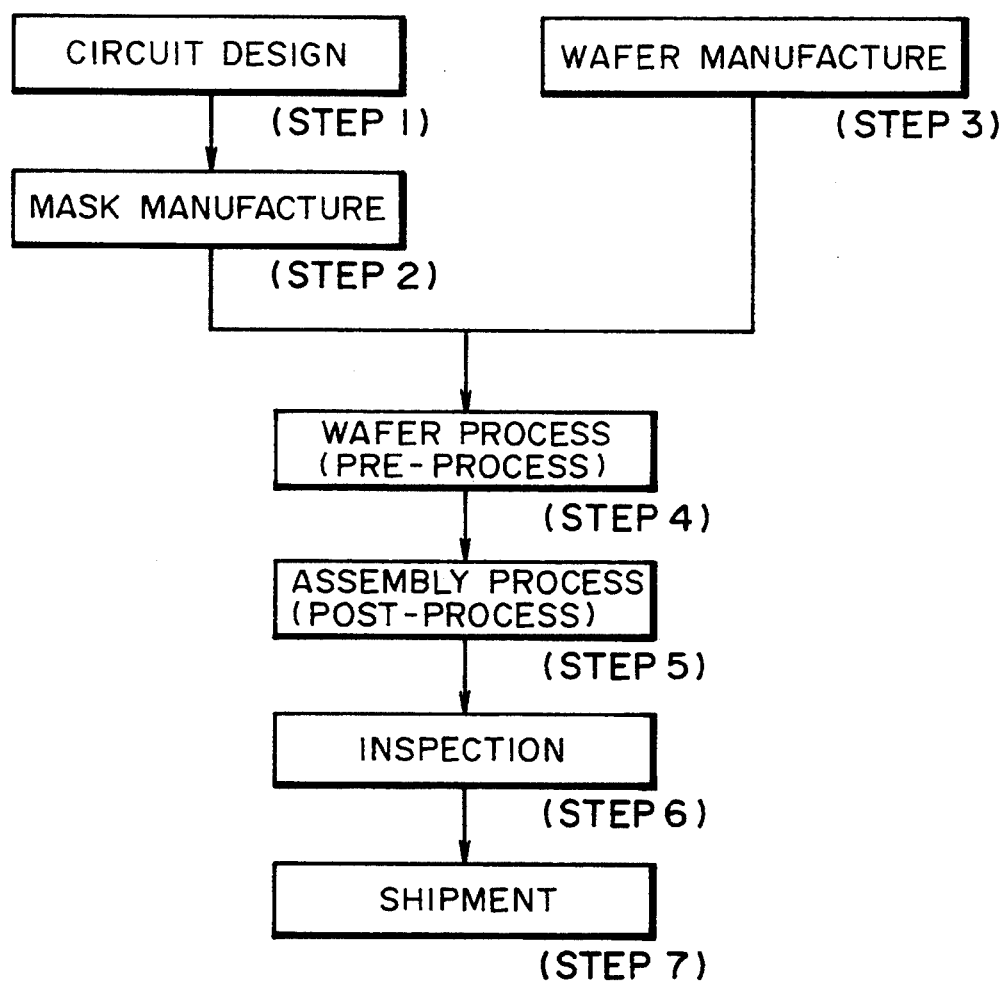
FIG. 39 is a flow chart of semiconductor device manufacturing processes.

FIG. 39 is a flow chart of the sequence of manufacturing a semiconductor device such as a semiconductor chip (e.g. IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein operability check, durability check and so on of the semiconductor devices produced by step 5 are carried out. With these processes, semiconductor devices are finished and they are shipped (step 7).

Figure 40:
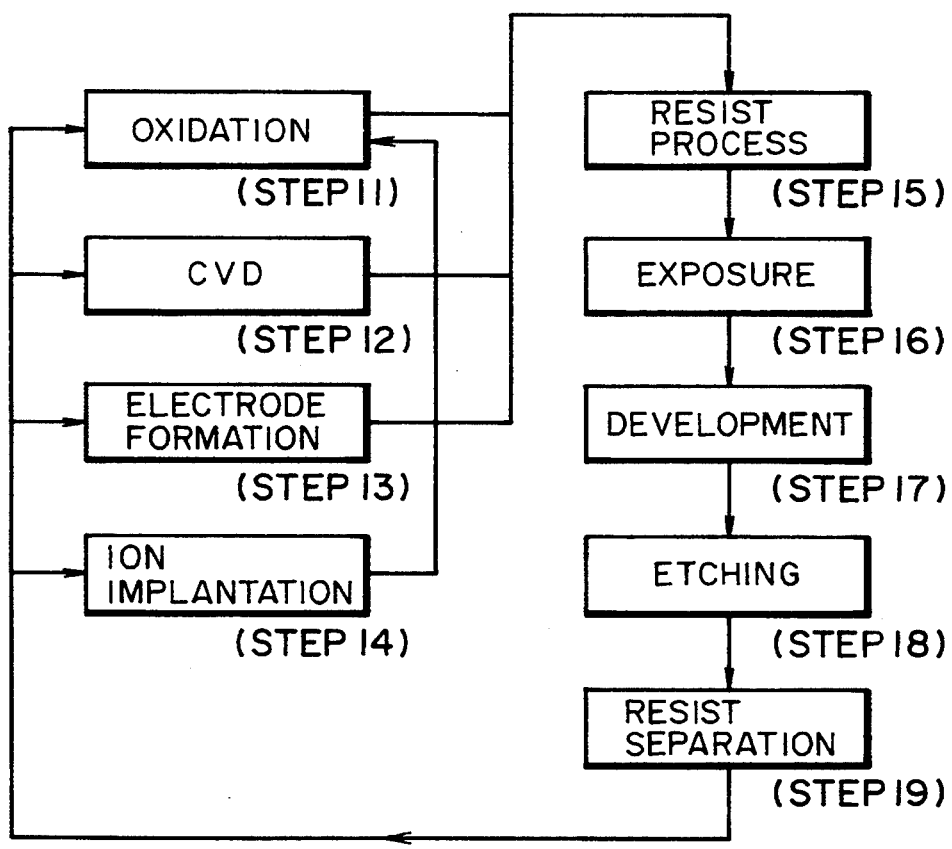
FIG. 40 is a flow chart of a wafer process.

FIG. 40 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. An X-ray apparatus, comprising:
   a mirror chamber;
   a mirror disposed in said mirror chamber and having a reflection surface for expanding an X-ray beam in a predetermined direction;
   detecting means having a detector disposed in said mirror chamber for detecting a relative positional relationship between the X-ray beam from a radiation source and said reflection surface with respect to a direction perpendicular to said reflection surface; and
   adjusting means for adjusting the relative position of the X-ray beam from the radiation source and said reflection surface on the basis of the detection.

2. An apparatus according to claim 1, wherein said radiation source comprises an SOR device.

3. An apparatus according to claim 1, further comprising means for projecting the X-ray beam, expanded by said mirror, to an article to be irradiated.

4. An apparatus according to claim 3, further comprising control means for controlling irradiation of the article with the X-ray beam.

5. An apparatus according to claim 1, further comprising means for projecting the X-ray beam, expanded by said mirror, to a mask and for transferring a pattern of the irradiated mask onto a wafer.

6. An apparatus according to claim 5, further comprising control means for controlling the exposure of the wafer with the X-ray beam.

7. An apparatus according to claim 1, further comprising computing means for computing the X-ray strength on the basis of the detection by said detecting means.

8. An apparatus according to claim 1, wherein said detecting means includes an X-ray detector.

9. An X-ray apparatus, comprising:
   a mirror having a reflection surface for expanding an X-ray beam in a predetermined direction;
   detecting means for detecting a relative positional relationship between the X-ray beam and said reflection surface with respect to a direction perpendicular to said reflection surface; and
   adjusting means for adjusting the relative position of the X-ray beam and reflection surface on the basis of the detection, wherein said detecting means includes first and second X-ray detectors which are disposed in series in the direction perpendicular to said reflection surface of said mirror.

10. An X-ray apparatus, comprising:
    a mirror chamber;
    a mirror disposed in said mirror chamber and having a reflection surface for expanding an X-ray beam in a predetermined direction;
    detecting means having a detector disposed in said mirror chamber for detecting the attitude of said reflection surface relative to the X-ray beam from a radiation source; and
    adjusting means for adjusting the attitude of said reflection surface relative to the X-ray beam from the radiation source on the basis of the detection.

11. An apparatus according to claim 10, wherein said radiation source comprises an SOR device.

12. An apparatus according to claim 10, further comprising means for projecting the X-ray beam, expanded by said mirror, to an article to be irradiated.

13. An apparatus according to claim 12, further comprising control means for controlling irradiation of the article with the X-ray beam.

14. An apparatus according to claim 10, further comprising means for projecting the X-ray beam, expanded by said mirror, to a mask and for transferring a pattern of the irradiated mask onto a wafer.

15. An apparatus according to claim 14, further comprising control means for controlling the exposure of the wafer with the X-ray beam.

16. An apparatus according to claim 10, wherein said adjusting means includes first driving means for rotationally moving said mirror around a first axis extending along the path of the X-ray beam, and second driving means for rotationally moving said mirror around a second axis perpendicular to the reflection surface of said mirror.

17. An apparatus according to claim 10, wherein said detecting means includes an X-ray detector.

18. A mirror system, comprising:
a mirror chamber;
a mirror disposed in said mirror chamber and having a reflection surface for reflecting a radiation beam from a synchrotron radiation source toward a predetermined direction;
detecting means having a detector disposed in said mirror chamber for detecting relative positional relationship between the radiation beam from the synchrotron radiation source and said reflection surface of said mirror; and
adjusting means for adjusting said mirror relative to the radiation beam from the synchrotrom radiation source, on the basis of the detection.

19. A device manufacturing method usable with a mask and a wafer as well as a mirror with a reflection surface for expanding an X-ray beam in a predetermined direction, said method comprising the steps of:
detecting, with a detector disposed in a mirror chamber, the relative position of the X-ray beam from a radiation source and the reflection surface of the mirror in a direction perpendicular to the reflection surface;
adjusting the relative position of the X-ray beam from the radiation source and the reflection surface on the basis of said detection; and
projecting the X-ray beam, expanded by the mirror, to a mask so as to transfer a pattern of the mask onto the wafer.

20. A device manufacturing method usable with a mask and a wafer as well as a mirror with a reflection surface for expanding an X-ray beam in a predetermined direction, said method comprising the steps of:
detecting, with a detector disposed in a mirror chamber, the attitude of the reflection surface of the mirror relative to the X-ray beam from a radiation source;
adjusting the attitude of the reflection surface of the mirror relative to the X-ray beam from the radiation source on the basis of said detection; and
projecting the X-ray beam, expanded by the mirror, to a mask so as to transfer a pattern of the mask onto the wafer.

21. A device manufactured by using a mask and a wafer as well as a mirror with a reflection surface for expanding an X-ray beam in a predetermined direction and in accordance with a method which comprises the steps of:
detecting, with a detector disposed in a mirror chamber, the relative position of the X-ray beam from a radiation source and the reflection surface of the mirror in a direction perpendicular to the reflection surface;
adjusting the relative position of the X-ray beam from the radiation source and the reflection surface on the basis of said detection; and
projecting the X-ray beam, expanded by the mirror, to a mask so as to transfer a pattern of the mask onto the wafer.

22. A device manufactured by using a mask and a wafer as well as a mirror with a reflection surface for expanding an X-ray beam in a predetermined direction and in accordance with a method which comprises the steps of:
detecting, with a detector disposed in a mirror chamber, the attitude of the reflection surface of the mirror relative to the X-ray beam from a radiation source;
adjusting the attitude of the reflection surface of the mirror relative to the X-ray beam from the radiation source on the basis of said detection; and
projecting the X-ray beam, expanded by the mirror, to a mask so as to transfer a pattern of the mask onto the wafer.

23. An X-ray apparatus, comprising:
a mirror having a reflection surface for expanding and X-ray beam in a predetermined direction;
detecting means for detecting the attitude of said reflection surface relative to the X-ray beam; and
adjusting means for adjusting the attitude of said reflection surface relative to the X-ray beam on the basis of the detection, wherein said detecting means includes an X-ray detector and said X-ray detector is disposed between said mirror and a radiation source which generates the radiation beam.

24. An X-ray apparatus, comprising:
a mirror having a reflection surface for expanding an X-ray beam in a predetermined direction;
detecting means for detecting a relative positional relationship between the X-ray beam and said reflection surface with respect to a direction perpendicular to said reflection surface; and
adjusting means for adjusting the relative position of the X-ray beam and said reflection surface on the basis of the detection, and said X-ray detector is disposed between said mirror and a radiation source which generates the radiation beam.

25. An X-ray apparatus, comprising:
a mirror having a reflection surface for expanding an X-ray beam in a predetermined direction;
detecting means for detecting a relative positional relationship between the X-ray beam and said reflection surface; and
adjusting means for adjusting the relative position of the X-ray beam and said reflection surface on the basis of the detection, wherein said detecting means includes first and second X-ray detectors which are disposed in series in the direction perpendicular to said reflection surface of said mirror.

26. An X-ray apparatus, comprising:
a mirror having a reflection surface for expanding an X-ray beam in a predetermined direction;
detecting means for detecting a relative positional relationship between the X-ray beam and said reflection surface; and
adjusting means for adjusting the relative position of the X-ray beam and said reflection surface on the basis of the detection, wherein said detecting means includes an X-ray detector and said X-ray detector is disposed between said mirror and a radiation source which generates the radiation beam.

27. An X-ray apparatus, comprising:

a mirror having a reflection surface for expanding an X-ray beam in a predetermined direction;

detecting means for detecting a relative positional relationship between the X-ray beam and said reflection surface; and adjusting means for adjusting the relative position of the X-ray beam and said reflection surface on the basis of the detection, wherein said detecting means includes an X-ray detector and said X-ray detector and said mirror are formed substantially as a unit.

28. An apparatus according to claim 25, 26 or 27, further comprising means for projecting the X-ray beam, expanded by said mirror, to an article to be irradiated.

29. An apparatus according to claim 28, further comprising control means for controlling irradiation of the article with the X-ray beam.

30. An apparatus according to claim 25, 26 or 27 further comprising means for projecting the X-ray beam, expanded by said mirror, to a mask and for transferring a pattern of the irradiated mask onto a wafer.

31. An apparatus according to claim 30, further comprising control means for controlling the exposure of the wafer with the X-ray beam.

32. An apparatus according to claim 25, 26 or 27, further comprising computing means for computing the X-ray strength on the basis of the detection by said detecting means.

* * * * *

UNITED STATES PATENT AND TRADEMARK OFFICE
CERTIFICATE OF CORRECTION

PATENT NO. : 5,448,612
DATED : September 5, 1995
INVENTOR(S) : Kasumi et al.

It is certified that error appears in the above-indentified patent and that said Letters Patent is hereby corrected as shown below: Title page,

[56] REFERENCES CITED:

FOREIGN PATENT DOCUMENTS, "3155100   7/1991   Japan
                          3288422  12/1991   Japan
                          4045417   2/1992   Japan
                          4080700   3/1992   Japan
                          4169900   6/1992   Japan" should
read --3-155100    7/1991   Japan
       3-288422  12/1991   Japan
       4-045417   2/1992   Japan
       4-080700   3/1992   Japan
       4-169900   6/1992   Japan--.

COLUMN 1:

Line 12, "subsgrate" should read --substrate--.

COLUMN 2:

Line 9, "tile" should read --the--.

COLUMN 3:

Line 27, "arid" should read --and--.

COLUMN 4:

Line 9, "beating" should read --bearing--.
Line 26, "tile" should read --the--.
Line 59, "Silt" should read --tilt--.
Line 61, "She" should read --the--.

UNITED STATES PATENT AND TRADEMARK OFFICE
CERTIFICATE OF CORRECTION

PATENT NO. : 5,448,612
DATED : September 5, 1995
INVENTOR(S) : Kasumi et al.

Page 2 of 4

It is certified that error appears in the above-indentified patent and that said Letters Patent is hereby corrected as shown below:

COLUMN 5:

Line 66, "6f" should read --of--.

COLUMN 6:

Line 50, "mixed" should read --fixed--.

COLUMN 8:

Line 1, "there" should read --these--.
Line 42, "cheer 105" should read --chamber 105--.
Line 56, "tile" should read --the--.

COLUMN 10:

Line 44, "plate-life" should read --plate-like--.
Line 51, "maim" should read --main--.
Line 53, "maim" should read --main--.

COLUMN 11:

Line 23, "connected-" should read --connected.--.

COLUMN 12:

Line 2, "cheer" should read --chamber--.

COLUMN 15:

Line 33, "comprised" should read --comprises--.

UNITED STATES PATENT AND TRADEMARK OFFICE
CERTIFICATE OF CORRECTION

PATENT NO. : 5,448,612
DATED : September 5, 1995
INVENTOR(S) : Kasumi et al.

It is certified that error appears in the above-indentified patent and that said Letters Patent is hereby corrected as shown below:

<u>COLUMN 16</u>:

Line 47, "tope" should read --top--.

<u>COLUMN 17</u>:

Line 29, "menders" should read --members--.

<u>COLUMN 19</u>:

Line 20, "tillable" should read --tiltable--.

<u>COLUMN 20</u>:

Line 9, "selves" should read --serves--.

<u>COLUMN 21</u>:

Line 15, "ms" should read --as--.

<u>COLUMN 23</u>:

Line 27, "add" should read --and--.
Line 48, "tile" should read --the--.

<u>COLUMN 24</u>:

Line 2, "beam i" should read --beam 1--.

<u>COLUMN 26</u>:

Line 18, "beam." should read --beam,--.
Line 44, "and" should read --and said--.

UNITED STATES PATENT AND TRADEMARK OFFICE
CERTIFICATE OF CORRECTION

PATENT NO.  : 5,448,612
DATED       : September 5, 1995
INVENTOR(S) : Kasumi et al.

It is certified that error appears in the above-indentified patent and that said Letters Patent is hereby corrected as shown below:

<u>COLUMN 27</u>:

Line 29, "synchrotrom" should read --synchrotron--.

<u>COLUMN 28</u>:

Line 26, "and" should read --an--.

Signed and Sealed this

Twelfth Day of March, 1996

BRUCE LEHMAN

Attest:

Attesting Officer

Commissioner of Patents and Trademarks